US009590038B1

(12) United States Patent
Kim et al.

(10) Patent No.: US 9,590,038 B1
(45) Date of Patent: Mar. 7, 2017

(54) SEMICONDUCTOR DEVICE HAVING NANOWIRE CHANNEL

(71) Applicants: Dong-Kwon Kim, Gimcheon-si (KR); Kang-Ill Seo, Chungcheongbuk-do (KR)

(72) Inventors: Dong-Kwon Kim, Gimcheon-si (KR); Kang-Ill Seo, Chungcheongbuk-do (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 14/921,006

(22) Filed: Oct. 23, 2015

(51) Int. Cl.
H01L 29/06 (2006.01)
H01L 29/423 (2006.01)
H01L 29/51 (2006.01)
H01L 29/78 (2006.01)

(52) U.S. Cl.
CPC .... *H01L 29/0673* (2013.01); *H01L 29/42392* (2013.01); *H01L 29/517* (2013.01); *H01L 29/785* (2013.01); *H01L 2029/7858* (2013.01)

(58) Field of Classification Search
None
See application file for complete search history.

(56) References Cited

U.S. PATENT DOCUMENTS

| | | | |
|---|---|---|---|
| 5,965,914 A | 10/1999 | Miyamoto | |
| 7,002,207 B2 | 2/2006 | Kim et al. | |
| 7,074,657 B2 | 7/2006 | Pan et al. | |
| 7,112,832 B2 | 9/2006 | Orlowski et al. | |
| 7,129,517 B2 | 10/2006 | Yang | |
| 7,151,019 B2 | 12/2006 | Yang | |
| 7,227,175 B2 | 6/2007 | Yang | |
| 7,253,484 B2 | 8/2007 | Pan et al. | |
| 7,427,788 B2 | 9/2008 | Li et al. | |
| 7,608,893 B2 | 10/2009 | Orlowski | |
| 7,759,737 B2 | 7/2010 | Cho et al. | |

(Continued)

FOREIGN PATENT DOCUMENTS

| | | |
|---|---|---|
| JP | 2007-511907 | 5/2007 |
| JP | 2014-220522 | 11/2014 |

(Continued)

OTHER PUBLICATIONS

Zheng, Peng, Daniel Connelly, Fei Ding, and Tsu-Jae King Liu. "FinFET Evolution Toward Stacked-Nanowire FET for CMOS Technology Scaling." IEEE Trans. Electron Devices IEEE Transactions on Electron Devices 62.12 (2015): 3945-950.*

*Primary Examiner* — Joseph Schoenholtz
(74) *Attorney, Agent, or Firm* — F. Chau & Associates, LLC

(57) ABSTRACT

A semiconductor device is provided as follows. A fin-type pattern includes first and second oxide regions in an upper portion of the fin-type pattern. The fin-type pattern is extended in a first direction. A first nanowire is extended in the first direction and spaced apart from the fin-type pattern. A gate electrode surrounds a periphery of the first nanowire, extending in a second direction intersecting the first direction. The gate electrode is disposed on a region of the fin-type pattern. The region is positioned between the first and the second oxide regions. A first source/drain is disposed on the first oxide region and connected with an end portion of the first nanowire.

19 Claims, 36 Drawing Sheets

(56) References Cited

U.S. PATENT DOCUMENTS

| | | |
|---|---|---|
| 7,781,290 B2 | 8/2010 | Lee et al. |
| 7,892,945 B2 | 2/2011 | Bedell et al. |
| 8,450,813 B2 | 5/2013 | Luo et al. |
| 2014/0001520 A1* | 1/2014 | Glass ................ H01L 29/66439 257/288 |
| 2014/0370667 A1 | 12/2014 | Sleight et al. |
| 2015/0243747 A1* | 8/2015 | Kittl ................... H01L 27/1211 257/401 |
| 2015/0303258 A1* | 10/2015 | Kuhn .................... B82Y 10/00 257/192 |
| 2016/0071945 A1* | 3/2016 | Wang ................ H01L 29/42392 257/347 |

FOREIGN PATENT DOCUMENTS

| | | |
|---|---|---|
| KR | 10-0604908 | 7/2006 |
| KR | 10-0652381 | 11/2006 |
| KR | 10-0781580 | 11/2007 |

\* cited by examiner

1200

SEMICONDUCTOR DEVICE HAVING NANOWIRE CHANNEL

TECHNICAL FIELD

The present inventive concept relates to a semiconductor device and a method of fabricating the same.

DISCUSSION OF RELATED ART

Multigate transistors have been suggested to integrate more transistors without degrading performances thereof. The multigate transistors include three-dimensional channels. Current control capability of the multigate transistors may be increased without increasing gate lengths thereof. Furthermore, short channel effect (SCE) may be suppressed.

SUMMARY

According to an exemplary embodiment of the present inventive concept, a semiconductor device is provided as follows. A fin-type pattern includes first and second oxide regions in an upper portion of the fin-type pattern. The fin-type pattern is extended in a first direction. A first nanowire is extended in the first direction and spaced apart from the fin-type pattern. A gate electrode surrounds a periphery of the first nanowire, extending in a second direction intersecting the first direction. The gate electrode is disposed on a region of the fin-type pattern. The region is positioned between the first and the second oxide regions. A first source/drain is disposed on the first oxide region and connected with an end portion of the first nanowire.

According to an exemplary embodiment of the present inventive concept, a semiconductor device is provided as follows. A substrate has an oxide region. A first and a second nanowires are spaced apart from the substrate, extending in a first direction, and spaced apart from each other in the first direction. A first gate electrode surrounds a periphery of the first nanowire, extending in a second direction intersecting the first direction. A second gate electrode surrounds a periphery of the second nanowire, extending in the second direction. A first and a second gate spacers are disposed on sidewalls of the first and the second gate electrodes, respectively. A trench is disposed between the first and the second gate electrodes. The trench is defined by the first and the second gate spacers, and the oxide region of the substrate. The oxide region defines a bottom surface of the trench without overlapping at least a portion of the first and the second gate electrodes. A source/drain is disposed on the oxide region, filling the trench.

According to an exemplary embodiment of the present inventive concept, a semiconductor device is provided as follows. A substrate has a first recess and a second recess spaced apart from each other. A first and a second oxide regions fill the first recess and the second recess. A nanowire is disposed on the substrate and spaced apart from the substrate. A gate electrode surrounds the nanowire. The gate electrode is disposed between the first oxide region and the second oxide region. A source and a drain are overlapped with the first and the second oxide regions, respectively.

According to an exemplary embodiment of the present inventive concept, a semiconductor device is provided as follows. A first nanowire is spaced apart from a substrate, extending in a first direction. A gate electrode surrounds a periphery of the first nanowire, extending in a second direction intersecting with the first direction. A source/drain is disposed on at least one side of the gate electrode and connected with the first nanowire. A contact is formed in the source/drain and overlapped in the first direction with the first nanowire. An etch stop layer is interposed between the contact and the substrate.

According to an exemplary embodiment of the present inventive concept, a method of manufacturing a semiconductor device is provided as follows. A fin-type structure extending in a first direction is formed on a substrate. The fin-type structure has a fin-type pattern, a pre-nanowire, a first semiconductor pattern and a second semiconductor pattern. The first and the second semiconductor patterns are stacked vertically on the fin-type pattern, and the pre-nanowire is interposed between the first and the second semiconductor patterns. A dummy gate electrode is formed on the fin-type structure, the dummy gate electrode intersecting the fin-type structure and extending in a second direction intersecting the first direction. A first spacer is formed on a sidewall of the dummy gate electrode. The dummy gate electrode and the first spacer overlap a first portion of the fin-type pattern. The first and the second semiconductor patterns of the fin-type structure which is not overlapped with the dummy gate electrode and the first spacer are removed to expose a second portion of the fin-type pattern and to form a nanowire patterned from the pre-nanowire. An oxide region is formed in an upper portion of the second portion of the fin-type pattern.

According to an exemplary embodiment of the present inventive concept, a method of manufacturing a semiconductor device is provided as follows. A fin-type pattern protruding from a substrate and extending in a first direction is formed. A nanowire spaced apart from an upper surface of the fin-type pattern and extended in the first direction is formed. An etch stop layer is formed in an upper region of the fin-type pattern. A source/drain is formed on the etch stop layer and the nanowire. The source/drain is epitaxially grown from the nanowire. A contact hole is formed in the source/drain by using an etching process until the etch stop layer is exposed. A contact is formed in the contact hole.

BRIEF DESCRIPTION OF THE DRAWINGS

These and other features of the inventive concept will become more apparent by describing in detail exemplary embodiments thereof with reference to the accompanying drawings of which.

Figure 1:
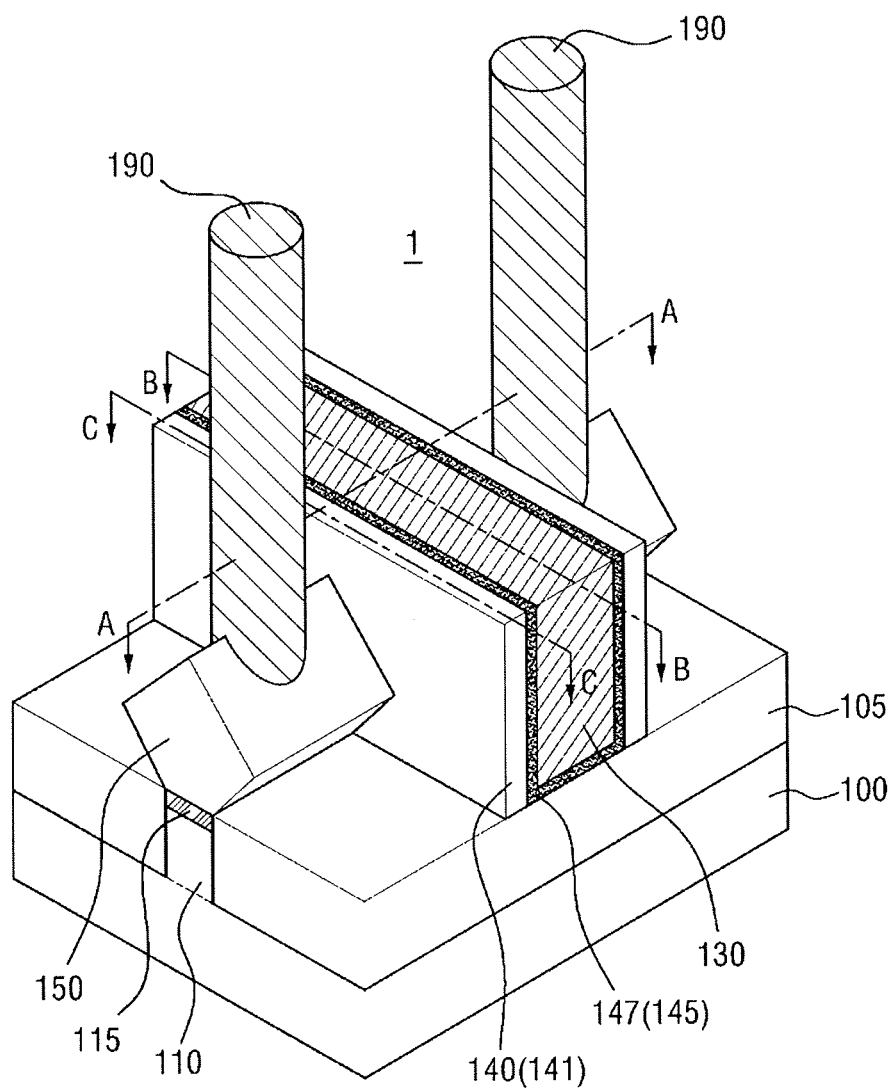
FIG. 1 is a perspective view of a semiconductor device according to an exemplary embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinbelow, a semiconductor device according to an embodiment will be explained with reference to FIGS. 1 to 5.

Figure 2:
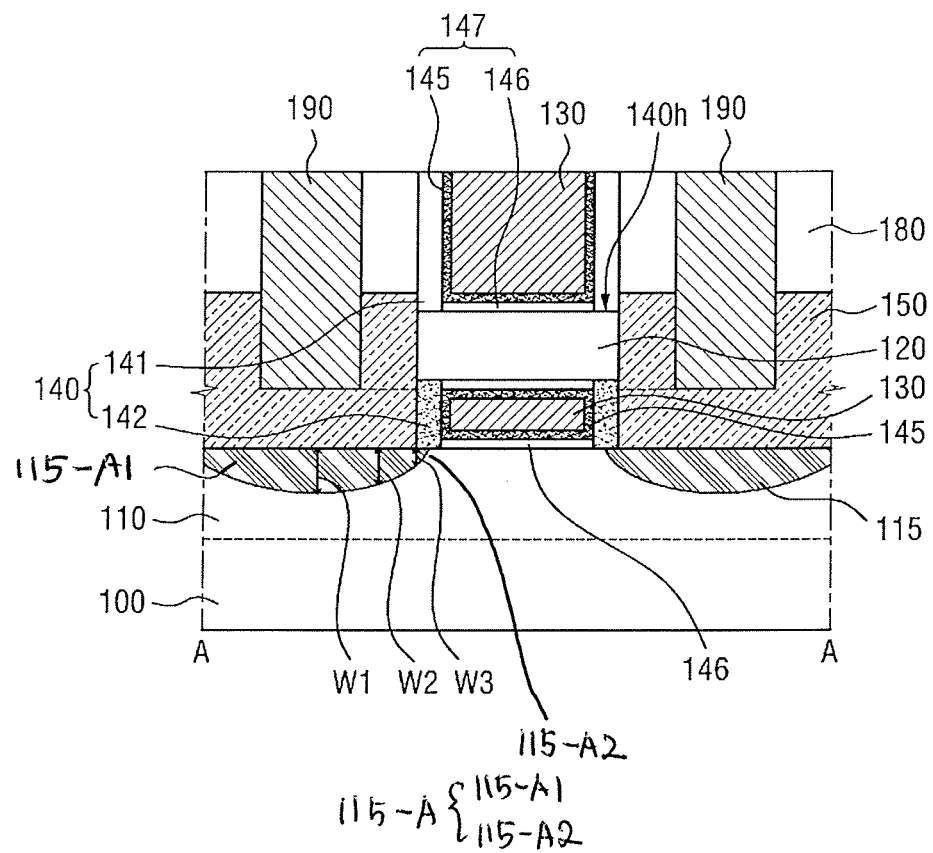
FIG. 2 is a cross sectional view taken along line A-A of FIG. 1.
Figure 3:
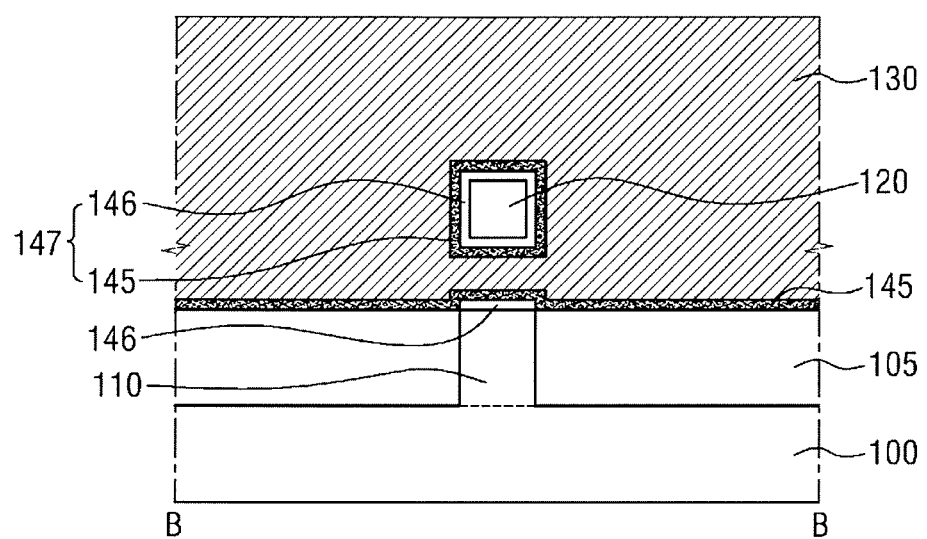
FIG. 3 is a cross sectional view taken along line B-B of FIG. 1.
Figure 4:
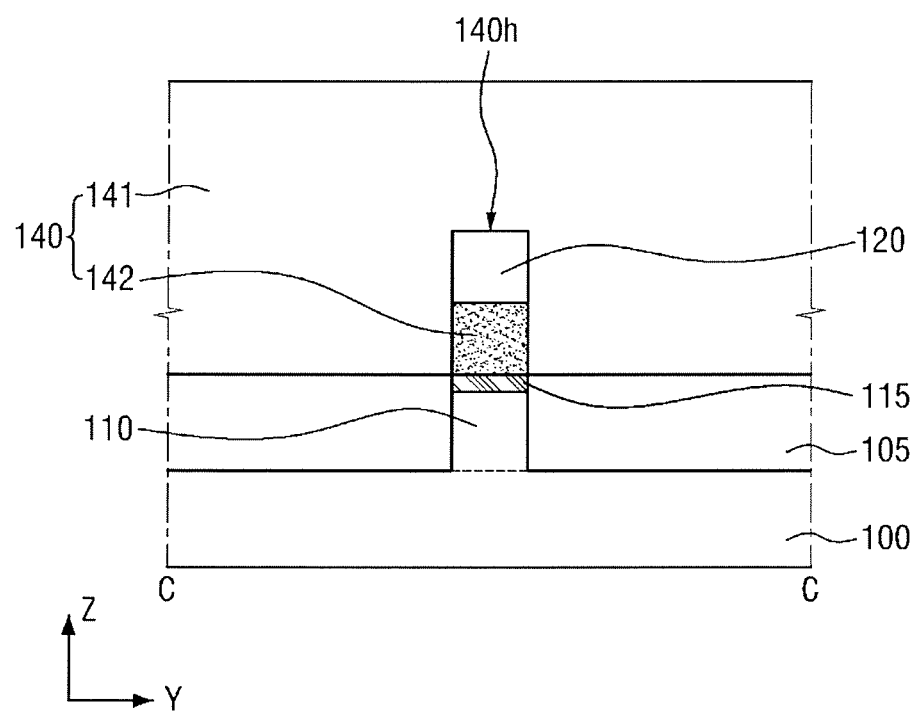
FIG. 4 is a cross sectional view taken along line C-C of FIG. 1.
Figure 5:
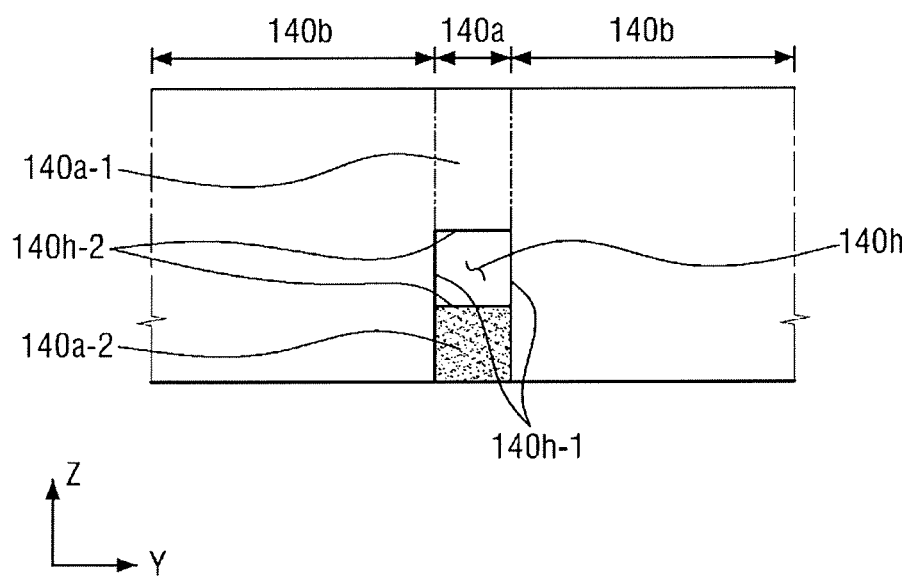
FIG. 5 illustrates the gate spacer of FIG. 4.

FIG. 1 is a perspective view of a semiconductor device according to an exemplary embodiment, and FIG. 2 is a cross sectional view taken along line A-A of FIG. 1. FIG. 3 is a cross sectional view taken along line B-B of FIG. 1, and FIG. 4 is a cross sectional view taken along line C-C of FIG. 1. FIG. 5 illustrates only the gate spacer of FIG. 4. For convenience of explanation, FIG. 1 omits illustration of an interlayer insulating layer 180 of FIG. 2.

Referring to FIGS. 1 to 5, a semiconductor device 1 according to an exemplary embodiment may include a fin-type pattern 110, a first nanowire 120, a gate electrode 130, a gate spacer 140, a source/drain 150, or a contact 190.

The substrate 100 may be a bulk silicon or a silicon-on-insulator (SOI), for example. Alternatively, the substrate 100 may be a silicon substrate, or may include other substance such as silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The fin-type pattern 110 may be protruded from the substrate 100. A field insulating layer 105 may at least partially cover the sidewall of the fin-type pattern 110. The fin-type pattern 110 may be defined by the field insulating layer 105. The field insulating layer 105 may include, for example, at least one of oxide, nitride, oxynitride, or a combination thereof.

As illustrated in FIG. 1, the sidewall of the fin-type pattern 110 may be completely surrounded by the field insulating layer 105, but note that this is only for illustrative purpose, and exemplary embodiments are not limited thereto.

The fin-type pattern 110 may be elongated in a first direction X. For example, the fin-type pattern 110 may include a longer side extending in the first direction X, and a shorter side extending in a second direction Y.

The fin-type pattern 110 may be formed by partially etching the substrate 100. Alternatively, the fin-type pattern 110 may include an epitaxial layer grown on the substrate 100. The fin-type pattern 110 may include an element semiconductor material such as silicon or germanium, for example. Further, the fin-type pattern 110 may include a compound semiconductor such as, for example, IV-IV group compound semiconductor or III-V group compound semiconductor.

For example, in a IV-IV group compound semiconductor, the fin-type pattern 110 may be a binary compound or a ternary compound including, for example, at least two or more of carbon (C), silicon (Si), germanium (Ge), and tin (Sn), or the above-mentioned binary or ternary compound doped with IV group element.

For example, in a III-V group compound semiconductor, the fin-type pattern 110 may be a binary compound, ternary compound or quaternary compound which is formed as a III group element which may be at least one of aluminum (Al), gallium (Ga), and indium (In), is combined with a V group element which may be at least one of phosphorus (P), arsenic (As) and antimony (Sb).

In the following description, it is assumed that the fin-type pattern 110 may include silicon.

An oxide region 115 may be formed on the fin-type pattern 110. The oxide region 115 may be formed within the substrate 100 and on an upper surface of the fin-type pattern 110 of the substrate 100. For example, the oxide region 115 may be formed to fill a recess formed within the substrate 100. The oxide region 115 may include an oxide layer. For example, the oxide region 115 may include a silicon oxide ($SiO_2$). The oxide region 115 may include a first oxide region 115-A and a second oxide region 115-B.

The oxide region 115 may be overlapped with the source/drain 150 which will be explained below. The oxide region 115 may be in direct contact with a lower surface of the source/drain 150. The oxide region 115 may prevent a parasitic planar transistor from occurring between the source/drain 150 and another source/drain 150 over the gate electrode 130, through the upper surface of the substrate 100. The oxide region 115 may be overlapped with the gate spacer 140 which will be explained below. The oxide region 115 may be in direct contact with a lower surface of the gate spacer 140. For example, the gate spacer 140 may be in direct contact with the lower surface of the inner spacer 142 which will be explained below.

The oxide region 115 may be in a concave shape. Accordingly, rather than having uniform depth, the oxide region 115 may have a greatest depth W1 at the center of the source/drain, and gradually decreasing depths W2, W3 as the distance increases from the center of the outer periphery of the source/drain 150 in the first direction X. The concave shape of the oxide region 115 may be created due to the distribution of oxygen in a plasma oxidation process or an ion implant process.

For example, the first oxide region 115-A may be in a concave shape. Accordingly, rather than having uniform depth, the first oxide region 115-A may have a greatest depth W1 at the center of the source/drain and a gradually decreasing depths W2 in a first region 115-A1 of the first oxide region 115-A, and a gradually decreasing depth W3 in a second region 115-A2 of the first oxide region 115-A as the distance increases from the center of the outer periphery of the source/drain 150 in the first direction X.

A first nanowire 120 may be formed on the substrate 100, and spaced from the substrate 100. The first nanowire 120 may extend in a first direction X.

The first nanowire 120 may be formed on the fin-type pattern 110, and spaced from the fin-type pattern 110. The first nanowire 120 may be overlapped with the fin-type pattern 110. The first nanowire 120 may be formed on the fin-type pattern 110, rather than being formed on the field insulating layer 105.

As illustrated in FIG. 3, the width of the first nanowire 120 in the second direction Y may be same as the width of the fin-type pattern 110 in the second direction Y, but note that this is assumed only for convenience of explanation and exemplary embodiments are not limited thereto. Further, although it is illustrated that the first nanowire 120 has a square cross section, exemplary embodiments are not limited thereto. The corner of the first nanowire 120 may be rounded by a process such as trimming.

The first nanowire 120 may be used as a channel region for the transistor. The first nanowire 120 may vary depending on whether the semiconductor device 1 is a p-type metal oxide semiconductor (PMOS) or an n-type metal oxide semiconductor (NMOS), but the present inventive concept is not limited thereto.

Further, the first nanowire 120 may include the same material as that of the fin-type pattern 110, or include a material different from that of the fin-type pattern 110. However, for convenience of explanation, it will be assumed herein that the first nanowire 120 of the semiconductor device may include silicon.

The gate electrode 130 may be formed on the field insulating layer 105 and the fin-type pattern 110. The gate electrode 130 may extend in the second direction Y.

The gate electrode 130 may be so formed as to surround the periphery of the first nanowire 120 which is spaced from an upper surface of the fin-type pattern 110. The gate electrode 130 may also be formed in a space defined between the first nanowire 120 and the fin-type pattern 110.

The gate electrode 130 may include a conductive material. As illustrated, the gate electrode 130 may be a single layer, but not limited thereto. For example, the gate electrode 130 may include a work function conductive layer which adjusts work function, and a filling conductive layer which fills a space formed by the work function conductive layer for work function adjustment.

For example, the gate electrode 130 may include at least one of TiN, WN, TaN, Ru, TiC, TaC, Ti, Ag, Al, TiAl, TiAlN, TiAlC, TaCN, TaSiN, Mn, Zr, W, and Al. Alternatively, the gate electrode 130 may each be formed of non-metal element such as Si or SiGe. For example, the gate electrode 130 described above may be formed by replacement process, but the present inventive concept is not limited thereto.

The gate spacer 140 may be formed on both sidewalls of the gate electrode 130 which extends in the second direction Y. The gate spacer 140 may be formed on both sides of the first nanowire 120, facing each other. The gate spacer 140 may each include a through hole 140h.

The first nanowire 120 may pass through the gate spacer 140. The first nanowire 120 may pass through the through hole 140h. The gate spacer 140 may be in a complete contact with a periphery of a portion of the side of the first nanowire 120.

When the corner of the first nanowire 120, which is surrounded by the gate electrode 130, is rounded by the process such as trimming, the portion of the side of the first nanowire 120 in contact with the gate spacer 140 may have a different cross section than a cross section of the first nanowire 120 surrounded by the gate electrode 130.

The gate spacer 140 may include an outer spacer 141 and an inner spacer 142. The outer spacer 141 may be in direct contact with the inner spacer 142. The inner spacer 142 may be disposed between the upper surface of the fin-type pattern 110 and the first nanowire 120, and in surface contact with the upper surface of the fin-type pattern 110. On a YZ cross section, the inner spacer 142 may be surrounded by the first nanowire 120, the first nanowire 120, and the outer spacer 141.

The through hole 140h of the gate spacer 140 may be defined by the outer spacer 141 and the inner spacer 142. An end of the first nanowire 120 may be in contact with the outer spacer 141 and the inner spacer 142.

Referring to FIG. 5, the through hole 140h may include first sides 140h-1 facing each other in the second direction Y, and second sides 140h-2 facing each other in a third direction Z. The second sides 140h-2 of the through hole 140h may connect the first side 140h-1 of the through hole 140h which are facing each other.

In the semiconductor devices according to the embodiments, at least one of the second sides 140h-2 of the through hole 140h may be defined by the inner spacer 142. However, the first sides 140h-1 of the through hole 140h may be defined by the outer spacer 141.

For example, the through hole 140h may include three sides 140h-1, 140h-2 defined by the outer spacer 141, and one side 140h-2 defined by the inner spacer 142.

Herein, the first side 140h-1 of the through hole 140h may be defined by the outer spacer 141. Further, one of the second sides 140h-2 of the through hole 140h may be defined by the outer spacer 141, but the other second side 140h-2 of the through hole 140h may be defined by the inner spacer 142.

The outer spacer 141 and the inner spacer 142 may include different materials from each other. When the material included in the outer spacer 141 has a first dielectric constant and the material included in the inner spacer 142 has a second dielectric constant, the first and the second dielectric constants may be different from each other.

The material included in the outer spacer 141 may have a greater dielectric constant than the material included in the inner spacer 142. It is possible to reduce the fringing capacitance between the gate electrode 130 and the source/drain 150 by having the second dielectric constant lower than the first dielectric constant.

For example, the outer spacer 141 may include at least one of silicon nitride (SiN), silicon oxynitride (SiON), silicon oxide (SiO$_2$), silicon oxycarbidenitride (SiOCN), and a combination thereof. For example, the inner spacer 142 may include at least one of a low-k dielectric material, silicon nitride (SiN), silicon oxynitride (SiON), silicon oxide (SiO$_2$), silicon oxycarbidenitride (SiOCN), and a combination thereof. The low-k dielectric material may be the material that has a lower dielectric constant than the silicon oxide.

The gate spacer 140 may include a first region 140a and a second region 140b. The second region 140b of the gate spacer may be disposed on both sides in the second direction Y with respect to the first region 140a of the gate spacer in the middle.

The first region 140a of the gate spacer may be the region where the first nanowire 120 is passed through. The second region 140b of the gate spacer may be the region where the first nanowire 120 need not pass through. For example, the through hole 140h of the gate spacer 140 may be included in the first region 140a of the gate spacer.

The second region 140b of the gate spacer may include the outer spacer 141 only. Meanwhile, the first region 140a of the gate spacer may include the outer spacer 141 and the inner spacer 142 of the fin-type pattern 110. The first region 140a of the gate spacer may include an upper portion 140a-1 and a lower portion 140a-2.

For example, the upper portion 140a-1 of the first region 140a of the gate spacer may include a portion of the outer spacer 141, and the lower portion 140a-2 of the first region 140a of the gate spacer may include the inner spacer 142. For example, the lower portion 140a-2 of the first region of the gate spacer may include the inner spacer 142 only.

The height from the upper surface of the substrate 100 to the upper portion 140a-1 of the first region 140a of the gate spacer is greater than the height from the upper surface of the substrate 100 to the lower portion 140a-2 of the first region 140a of the gate spacer.

At least one of the second sides 140h-2 of the through hole 140h may be defined by the lower portion 140a-2 of the second region of the gate spacer (i.e., the inner spacer 142). However, the first side 140h-1 of the through hole 140h may be defined by the upper portion 140a-1 of the first region of the gate spacer (i.e., the outer spacer 141).

The lower portion 140a-2 of the first region of the gate spacer may be in direct contact with the second region 140b of the gate spacer. Further, the second region 140b of the gate spacer and the upper portion 140a-1 of the first region of the gate spacer are included in the outer spacer 141. Accordingly, the second region 140b of the gate spacer and the upper portion 140a-1 of the first region of the gate spacer may be an integral structure.

The uppermost portion of the first nanowire 120 may be in contact with the outer spacer 141, for example, at an overlapping portion between the gate spacer 140 and the first nanowire 120. In other words, the uppermost portion of the first nanowire 120 may be in contact with the upper portion 140a-1 of the first portion of the gate spacer.

Accordingly, at the first region 140a of the gate spacer, the lowermost portion of the first nanowire 120 may be in contact with the lower portion 140a-2 of the first region of the gate spacer, and the uppermost portion of the first nanowire 120 may be in contact with the upper portion 140a-1 of the first region of the gate spacer.

For example, at the first region 140a of the gate spacer, the lowermost portion of the first nanowire 120 may be in contact with the inner spacer 142, and the uppermost portion of the first nanowire 120 may be in contact with the outer spacer 141.

The gate insulating layer 147 may be formed between the first nanowire 120 and the gate electrode 130. Further, the gate insulating layer 147 may be formed between the field insulating layer 105 and the gate electrode 130, between the fin-type pattern 110 and the gate electrode 130, and between the gate spacer 140 and the gate electrode 130.

For example, the gate insulating layer 147 may include an interface layer 146 and a high-k insulating layer 145, but not limited thereto. For example, the interface layer 146 of the gate insulating layer 147 may be omitted depending on a material for the first nanowire 120.

Because the interface layer 146 may be formed on a periphery of the first nanowire 120, the interface layer 146 may be formed between the first nanowire 120 and the gate electrode 130, and between the fin-type pattern 110 and the gate electrode 130. Meanwhile, the high-k insulating layer 145 may be formed between the first nanowire 120 and the gate electrode 130, between the fin-type pattern 110 and the gate electrode 130, between the field insulating layer 105 and the gate electrode 130, and between the gate spacer 140 and the gate electrode 130.

The gate insulating layer 147 may be formed along the periphery of the first nanowire 120. The gate electrode 147 may be formed along the upper surface of the field insulating layer 105 and the upper surface of the fin-type pattern 110. Additionally, the gate insulating layer 147 may be formed along the sidewall of the gate spacer 140. For example, the gate insulating layer 147 may be formed along the sidewalls of the outer spacer 141 and the inner spacer 142.

When the first nanowire 120 includes silicon, the interface layer 146 may include silicon oxide layer. At this time, the interface layer 146 may be formed on the periphery of the first nanowire 120 and the upper surface of the fin-type pattern 110, but need not be formed along the sidewall of the gate spacer 140.

The high-k insulating layer 145 may include a high-k dielectric material having a higher dielectric constant than silicon oxide layer. For example, the high-k dielectric material may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but the present inventive concept is not limited thereto.

As described above, when the interface layer 146 is omitted, the high-k insulating layer 145 may include not only the high-k dielectric material, but also silicon oxide layer, silicon oxynitride layer, or silicon nitride layer.

Referring to FIGS. 1 and 2, the first nanowire 120 may be protruded to the first direction X beyond the gate insulating layer 147 formed on the sidewall of the gate electrode 130 (i.e., the high-k insulating layer 145). As described, the protruding end of the first nanowire 120 may pass through the gate spacer 140 via the through hole 140h.

The source/drain 150 may be formed on both sides of the gate electrode 130. The source/drain 150 may be formed on the fin-type pattern 110. The source/drain 150 may include an epitaxial layer formed on an upper surface of the fin-type pattern 110.

An outer circumference of the source/drain 150 may take on a variety of shapes. For example, the outer circumference of the source/drain 150 may be at least one of diamond, circle, rectangle, and octagon shapes. FIG. 1 illustrates a diamond shape (or pentagon or hexagon shape), for an example.

The source/drain 150 may be directly connected with the first nanowire 120 which is used as the channel region. For example, the source/drain 150 may be directly connected with the first nanowire 120 which is passed through the through hole 140h of the gate spacer 140.

However, the source/drain 150 need not be in direct contact with the gate insulating layer 147. The gate spacer 140 may be located between the source/drain 150 and the gate insulating layer 147. For example, one sidewall of the inner spacer 142 may be in contact with the gate insulating layer 147, while the other sidewall of the inner spacer 142 may be in contact with the source/drain 150, in which case the source/drain 150 and the gate insulating layer 147 need not be contacted with each other between the first nanowire 120 and the substrate 100. Further, since the outer spacer 141 is in contact with the uppermost portion of the first nanowire 120, the source/drain 150 and the gate insulating layer 147 need not be contacted with each other over the first nanowire 120.

An interlayer insulating layer 180 may be formed on the source/drain 150. The interlayer insulating layer 180 may include at least one of a low-k dielectric material, oxide, nitride and oxynitride. For example, the low-k dielectric material may include flowable oxide (FOX), Tonen SilaZen (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), high density plasma (HDP) oxide, plasma enhanced oxide (PEOX), flowable CVD (FCVD) oxide, or a combination thereof.

A contact 190 may be formed in the interlayer insulating layer 180 and the source/drain 150. The contact 190 may pass through the interlayer insulating layer 180. The contact 190 may be formed in the source/drain 150. For example, a side surface of the contact 190 may be in contact with the interlayer insulating layer 180 and the source/drain 150, and a lower surface of the contact 190 may be in contact with the source/drain 150.

A lower surface of the contact 190 may be lower than the lower surface of the first nanowire 120. Forming the lower surface of the contact 190 to be lower than the lower surface of the first nanowire 120 can enhance performance of the semiconductor device 1, as it shortens an electrical path formed between the first nanowire 120 and the contact 190.

The contact 190 may include a conductive material. For example, the contact 190 may include at least one of polysilicon, metal silicide compound, conductive metal nitride and metal, but not limited thereto.

The semiconductor device 1 according to an embodiment has the oxide region 115 at an interface between the source/drain 150 and the substrate 100. Accordingly, the substrate 100 and the source/drain 150 are insulated from each other by the presence of the oxide region 115. The source/drain 150 may be formed on both sides of the gate electrode 130 and connected to each other through the first nanowire 120. However, the source/drain 150 may additionally form a parasitic planar transistor through the upper surface of the substrate 100. Accordingly, a parasitic planar transistor structure may be added to the original transistor structure, which will result in a semiconductor device with different performance from a desired transistor performance. The semiconductor device 1 according to an embodiment can prevent possibility of forming the parasitic planar transistor structure, by forming the oxide region 115 on the substrate 100, which will electrically isolate the source/drain 150 and the substrate 100.

Hereinbelow, a semiconductor device according to another embodiment will be explained with reference to FIG. 1 and FIGS. 6 to 8. For convenience of explanation, differences that are not explained above with reference to FIGS. 1 to 5 will be mainly explained below.

Figure 6:
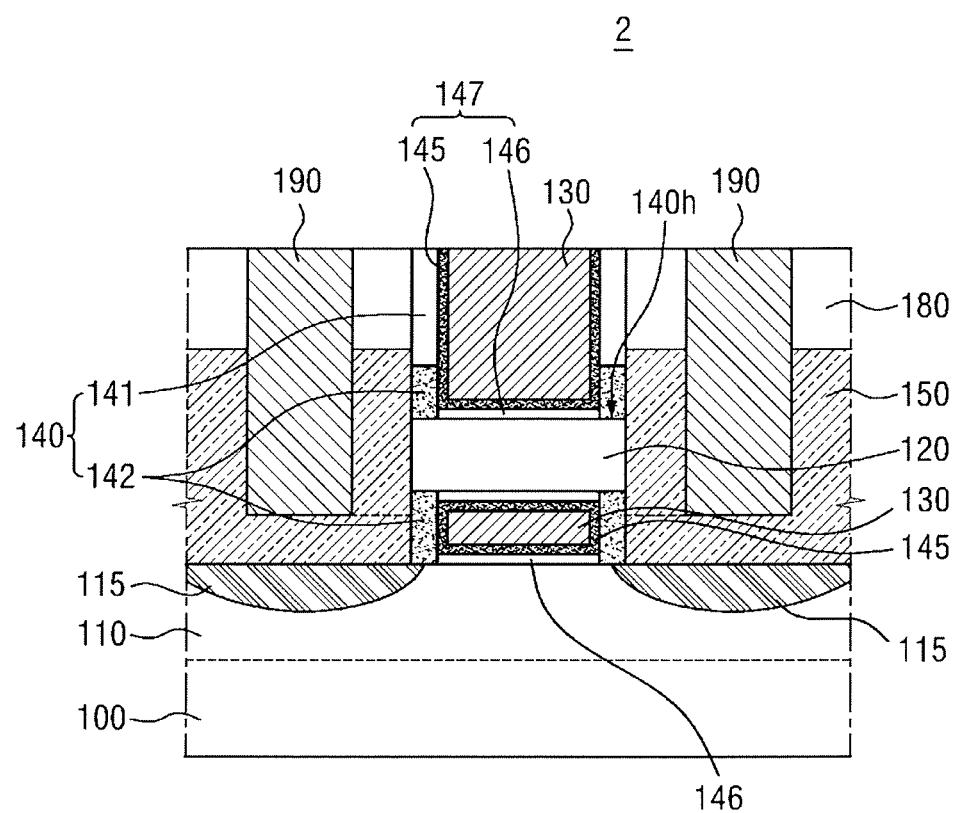
FIGS. 6 to 8 are views of a semiconductor device according to an exemplary embodiment of the present inventive concept.
Figure 7:
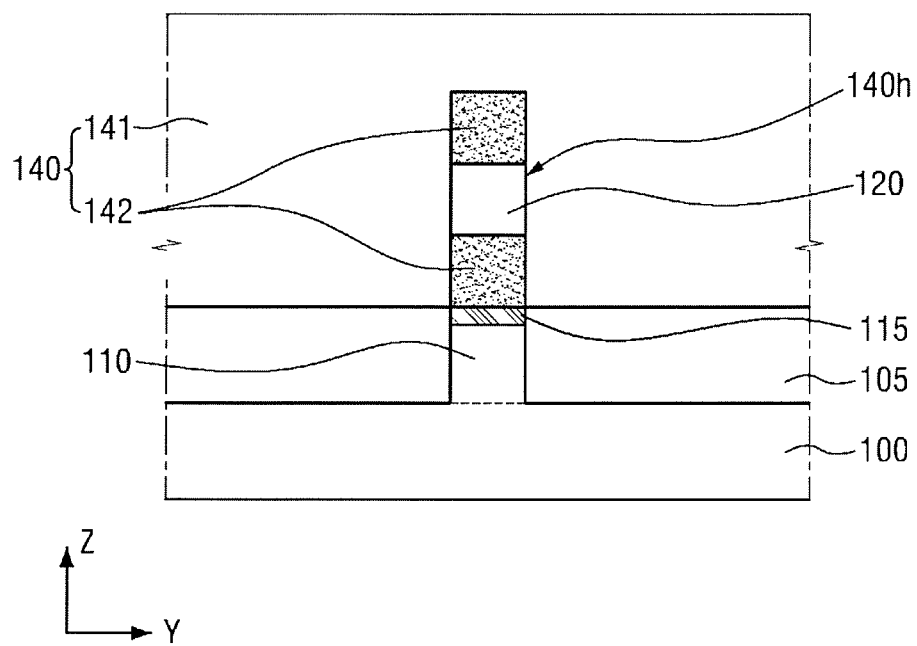
Figure 8:
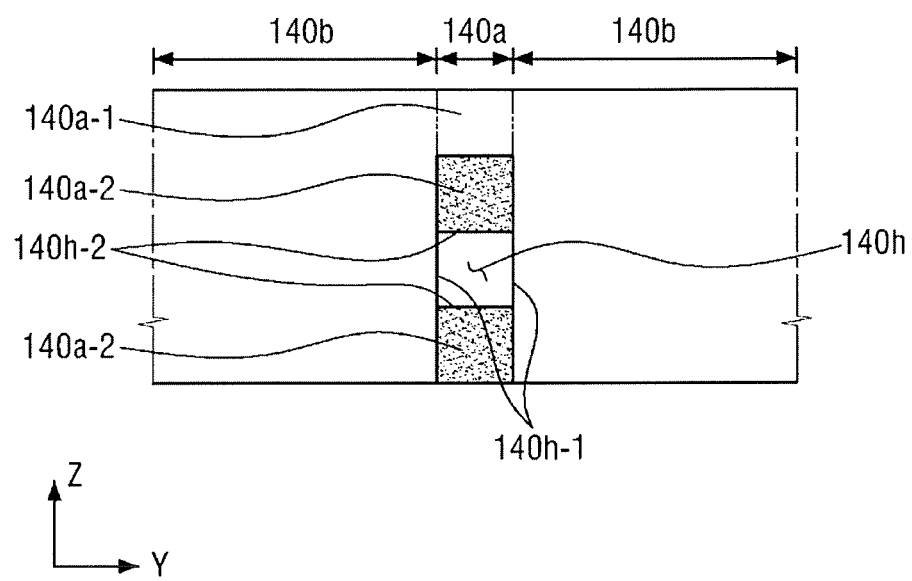

FIGS. 6 to 8 are views provided to explain a semiconductor device according to an exemplary embodiment.

For reference, FIG. 6 is a cross sectional view taken along line A-A of FIG. 1. FIG. 7 is a cross sectional view taken along line C-C of FIG. 1. FIG. 8 illustrates only the gate spacer of FIG. 7.

Referring to FIGS. 6 to 8, in a semiconductor device 2 according to another embodiment, the lower portion 140a-2 of the first region of the gate spacer may include a plurality of insulating patterns which are spaced in a third direction Z.

Accordingly, the uppermost portion of the first nanowire 120 and the lowermost portion of the first nanowire 120 may be contacted with the lower portion 140a-2 of the first portion of the gate spacer.

The uppermost portion of the first nanowire 120 and the lowermost portion of the first nanowire 120 may be contacted with the inner spacer 142. In the first region 140a of the gate spacer, the inner spacer 142, having a material with a lower dielectric constant than the outer spacer 141, is disposed over and under the first nanowire 120.

For example, the through hole 140h may include two sides 140h-1 defined by the outer spacer 141, and two sides 140h-2 defined by the inner spacer 142.

The first sides 140h-1 of the through hole 140h facing each other in the second direction Y may be defined by the outer spacer 141, and the second sides 140h-2 of the through hole 140h facing each other in the third direction Z may be defined by the inner spacer 142.

Hereinbelow, a semiconductor device according to an exemplary embodiment will be explained with reference to FIG. 1 and FIGS. 9 to 11. For convenience of explanation, differences that are not explained above with reference to FIGS. 1 to 5 will be mainly explained below.

Figure 9:
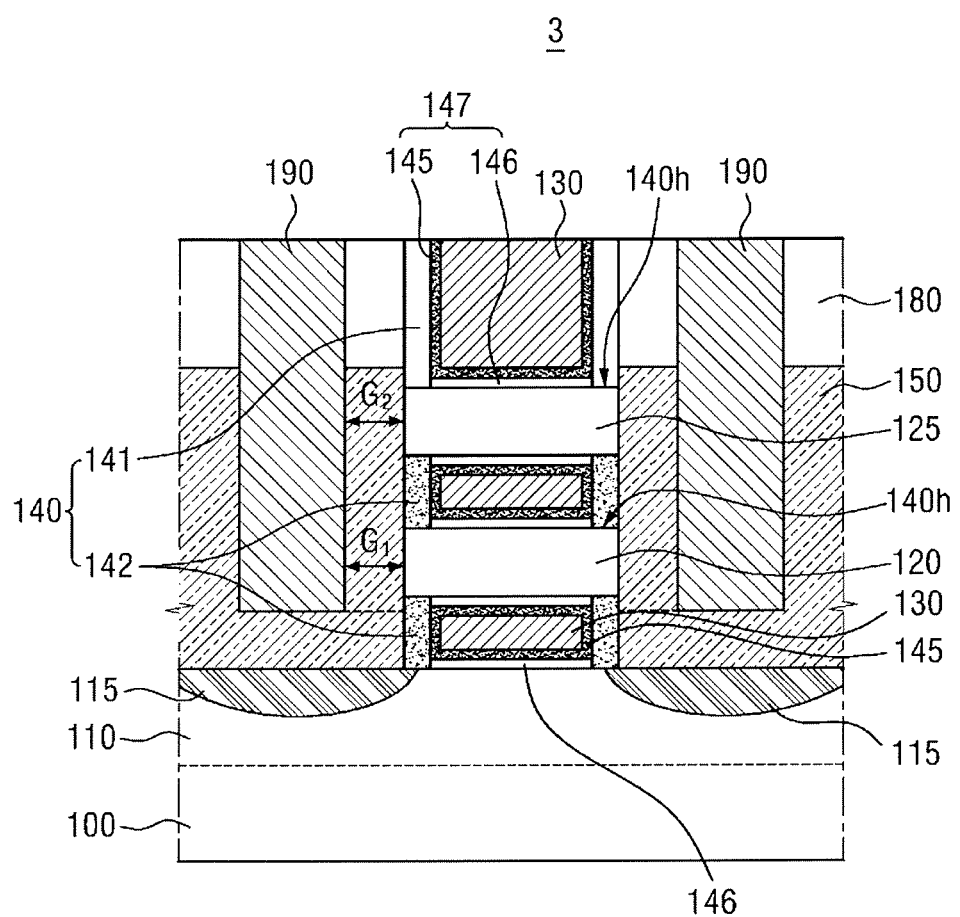
FIGS. 9 to 11 are cross sectional views of a semiconductor device according to an exemplary embodiment of the present inventive concept.
Figure 10:
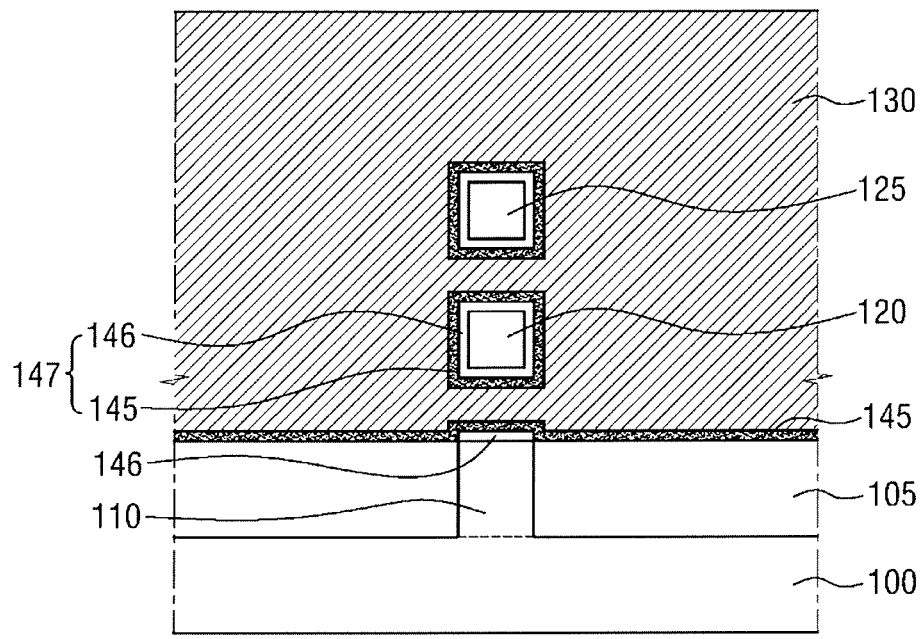
Figure 11:
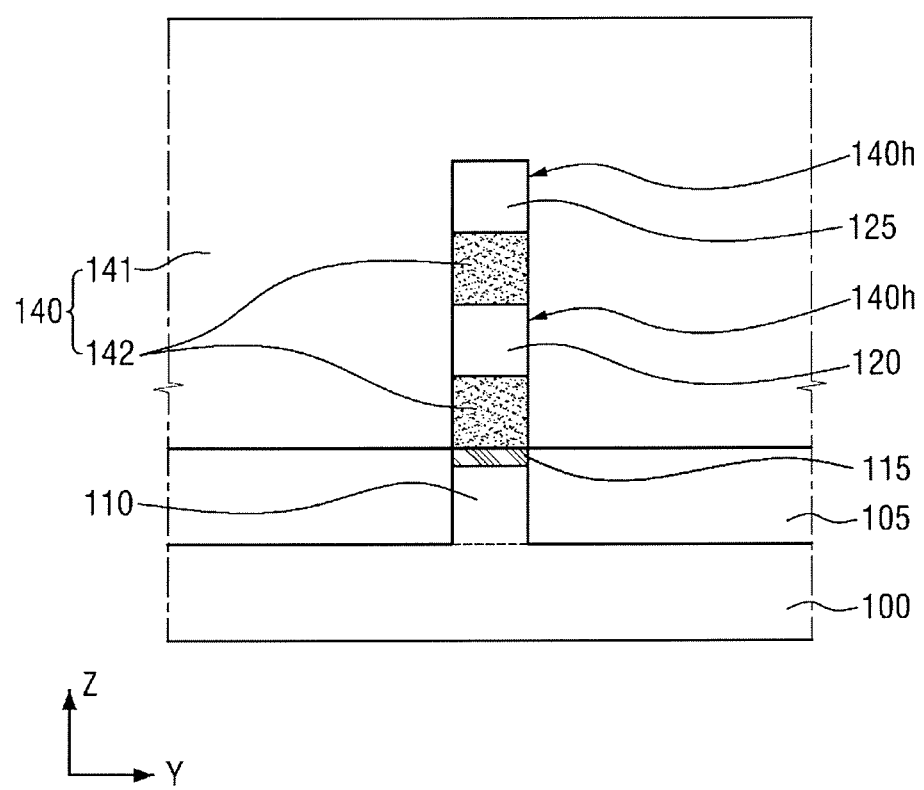

FIGS. 9 to 11 are cross sectional views of a semiconductor device according to an exemplary embodiment.

FIG. 9 is a cross sectional view taken along line A-A of FIG. 1. FIG. 10 is a cross sectional view taken along line B-B of FIG. 1. FIG. 11 is a cross sectional view taken along line C-C of FIG. 1.

Referring to FIGS. 9 to 11, a semiconductor device 3 according to an exemplary embodiment may include a second nanowire 125.

The second nanowire 125 may be formed on the substrate 100, while being spaced apart from the substrate 100. The second nanowire 125 may extend in the first direction X.

The second nanowire 125 may be spaced from the substrate 100 farther than the first nanowire 120 is. For example, the height from the upper surface of the fin-type pattern 110 to the second nanowire 125 is greater than the height from the upper surface of the fin-type pattern 110 to the first nanowire 120.

The second nanowire 125 may be overlapped with the fin-type pattern 110. The second nanowire 125 may be formed on the fin-type pattern 110, rather than being formed on the field insulating layer 105.

The second nanowire 125 may be used as a channel region for the transistor. Accordingly, the second nanowire 125 may include the same material as the first nanowire 120.

The gate electrode 130 may be formed to surround the periphery of the first nanowire 125. The gate electrode 130 may be formed in the space defined between the first nanowire 120 and the second nanowire 125.

The gate spacer 140 may be disposed on both ends of the first nanowire 120 and on both ends of the second nanowire 125. The gate spacer 140 may each include a plurality of through holes 140h.

The second nanowire 125 may pass through the gate spacer 140. The second nanowire 125 may pass through one of the plurality of through holes 140h. The periphery of the end of the second nanowire 125 may be completely contacted with the gate spacer 140.

Like the first nanowire 120, when the corner of the second nanowire 125, which is surrounded by the gate electrode 130, is rounded by the process such as trimming, the end of the second nanowire 125 in contact with the gate spacer 140 may have a different cross section than a cross section of the second nanowire 125 surrounded by the gate electrode 130.

The second nanowire 125 may be aligned with the first nanowire 120. The second nanowire 125 may be overlapped with the first nanowire 120 in the third direction Z. The first and second nanowires 120, 125 may have equal length to each other. However, exemplary embodiments are not limited to the example given above.

The inner spacer 142 may be disposed between the upper surface of the fin-type pattern 110 and the first nanowire 120, and between the first nanowire 120 and the second nanowire 125. For example, the inner spacer 142 may include a plurality of insulating patterns spaced apart from each other in the third direction Z.

Referring to FIG. 9, the uppermost surface of the second nanowire 125 may be in contact with the outer spacer 141 and the lowermost surface of the second nanowire 125 may be in contact with the inner spacer 142, although exemplary embodiments are not limited thereto. For example, as illustrated in FIG. 6, the uppermost surface of the second nanowire 125 and the lowermost surface of the second nanowire 125 may be in contact with the inner spacer 142, respectively.

The gate insulating layer 147 may be formed between the second nanowire 125 and the gate electrode 130. The gate insulating layer 147 may be formed along the periphery of the second nanowire 125.

The source/drain 150 may be directly connected with the second nanowire 125 which is used as the channel region. For example, the source/drain 150 may be directly connected with the first nanowire 120 and the second nanowire 125 which are passed through the through hole 140h of the gate spacer 140.

The contact 190 may be at a first distance G1 from the first nanowire 120 and at a second distance G2 from the second nanowire 125. The contact 190 may be overlapped with the first nanowire 120 and the second nanowire 125 in the first direction X. For example, the lower surface of the contact 190 may be formed to be lower than the lower surface of the first nanowire 120 and the second nanowire 125. Accordingly, the electrical path between the contact 190 and the first nanowire 120, and the electrical path between the contact 190 and the second nanowire 125 may be shortened to the first distance G1 and the second distance G2, respectively. The first distance G1 and the second distance G2 may be the same, but the present inventive concept is not limited thereto.

Hereinbelow, a semiconductor device 4 according to an exemplary embodiment will be explained with reference to FIGS. 1 to 12. For convenience of explanation, differences that are not explained above with reference to FIGS. 1 to 5 will be mainly explained below.

Figure 12:
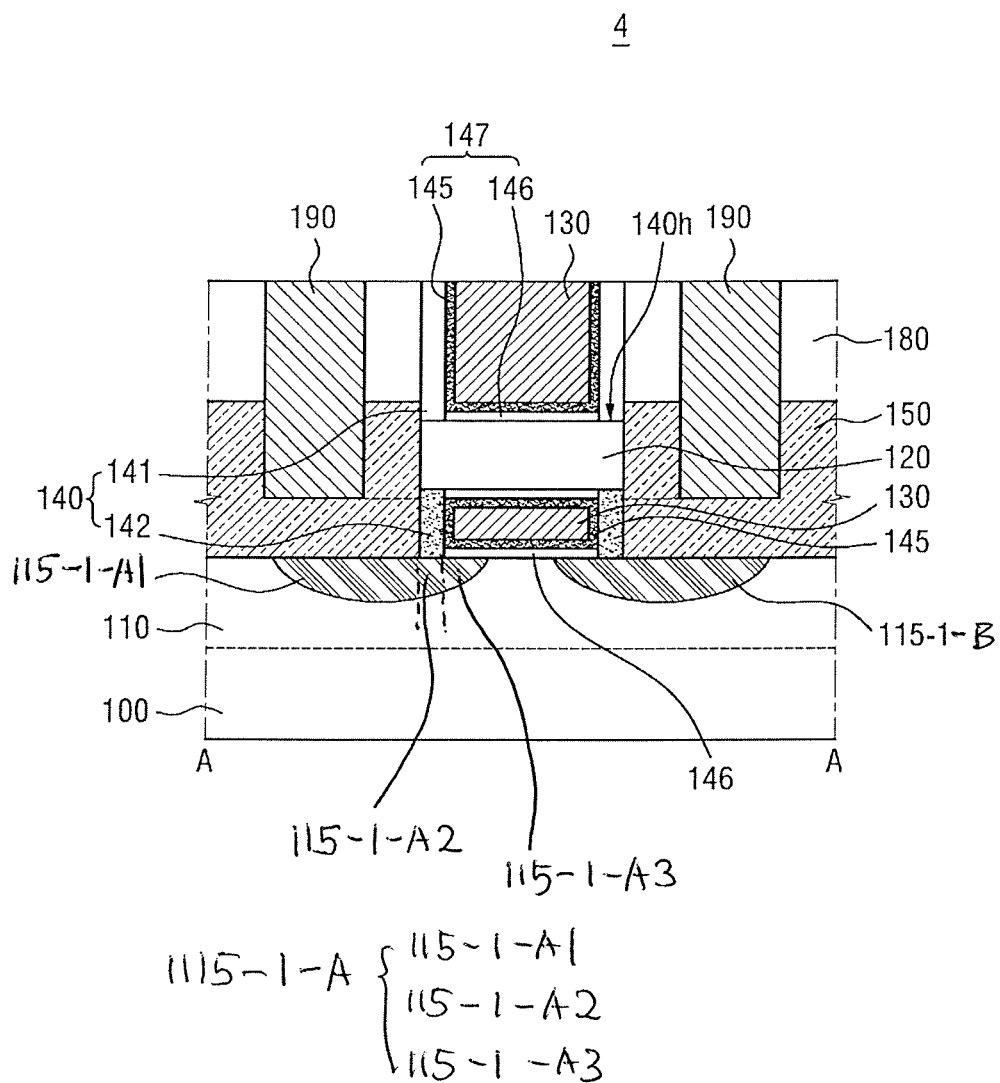
FIG. 12 is a cross sectional view of a semiconductor device according to an exemplary embodiment of the present inventive concept.

FIG. 12 is a cross sectional view of a semiconductor device according to an exemplary embodiment. FIG. 12 is a cross sectional view taken along line A-A of FIG. 1.

Referring to FIG. 12, the oxide region 115-1 may be overlapped with the gate electrode 130. However, the oxide region 115-1 need not be overlapped with a portion of the gate electrode 130. For example, the oxide region 115-1 may be overlapped with only a portion of the gate electrode 130. The oxide region 115-1 may be formed on both sides of the gate electrode 130 and isolated from each other. The oxide region 115-1 may be overlapped with a portion of the gate electrode 130, the gate spacer 140 and a portion of the source/drain 150.

For example, considering that the oxide region 115-1 is provided to prevent formation of a parasitic planar transistor between the two source/drains 150 located on both sides of the gate electrode 130, overlapping with the gate spacer 140 and the gate electrode 130 is possible. For example, when the oxide region 115-1 extends in the first direction X to be overlapped with the gate electrode 130, this may prevent formation of the a parasitic planar transistor and as a result, the semiconductor device may become more reliable. In this case, the oxide region 115-1 may include a first oxide region 115-1-A and a second oxide region 115-1-B. The first oxide region 115-1-A may have a first region 115-1-A1 overlapped with the source/drain 150, a second region 115-1-A2 overlapped with the gate spacer 140 and a third region 115-1-A3 overlapped with the gate electrode 130.

The oxide region 115-1 may be overlapped with only a portion of the source/drain 150, instead of being completely overlapped with the source/drain 150. Since the oxide region 115-1 insulates among the source/drains 150, the presence of the oxide region 115-1 formed at least in a vicinity to the gate electrode 130 of the source/drain 150 may provide a sufficient parasitic planar transistor prevention effect. The present inventive concept is not limited thereto. For example, the oxide region 115-1 may be completely overlapped with the source/drain 150.

Hereinbelow, a semiconductor device 5 according to an embodiment will be explained with reference to FIGS. 1 to 13. For convenience of explanation, differences that are not explained above with reference to FIGS. 1 to 5 will be mainly explained below.

Figure 13:
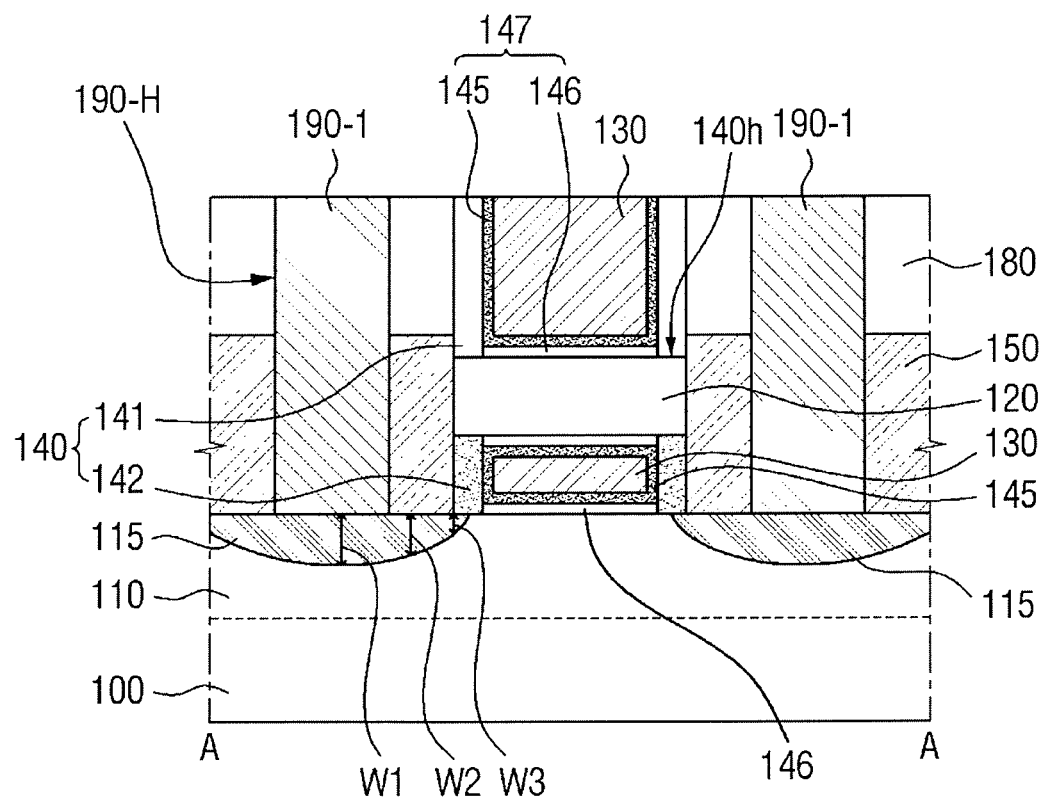
FIG. 13 is a cross sectional view of a semiconductor device according to an exemplary embodiment of the present inventive concept.

FIG. 13 is a cross sectional view of a semiconductor device according to an exemplary embodiment. FIG. 13 is a cross sectional view taken along line A-A of FIG. 1.

Referring to FIG. 13, the contact 190-1 may completely pass through the interlayer insulating layer 180 and the source/drain 150 to be in contact with the oxide region 115. The lower surface of the contact 190-1 may be in direct contact with the oxide region 115 which is formed on the upper surface of the substrate 100. The lower surface of the contact 190-1 may be insulated from the substrate 100 by the oxide region 115. The device according to an embodiment can increase efficiency of the process, because the oxide region 115 may serve as an etch stop layer in the process of forming the contact 190-1.

To form the contact 190-1, a contact hole 190-H may be formed by using an etching process. In doing so, the oxide region 115 may serve as an etch stop layer to prevent further etching of the fin-type pattern 110 from occurring Hereinbelow, a semiconductor device according to an exemplary embodiment will be explained with reference to FIGS. 14 and 15. For convenience of explanation, differences that are not explained above with reference to FIGS. 1 to 5 will be mainly explained below.

Figure 14:
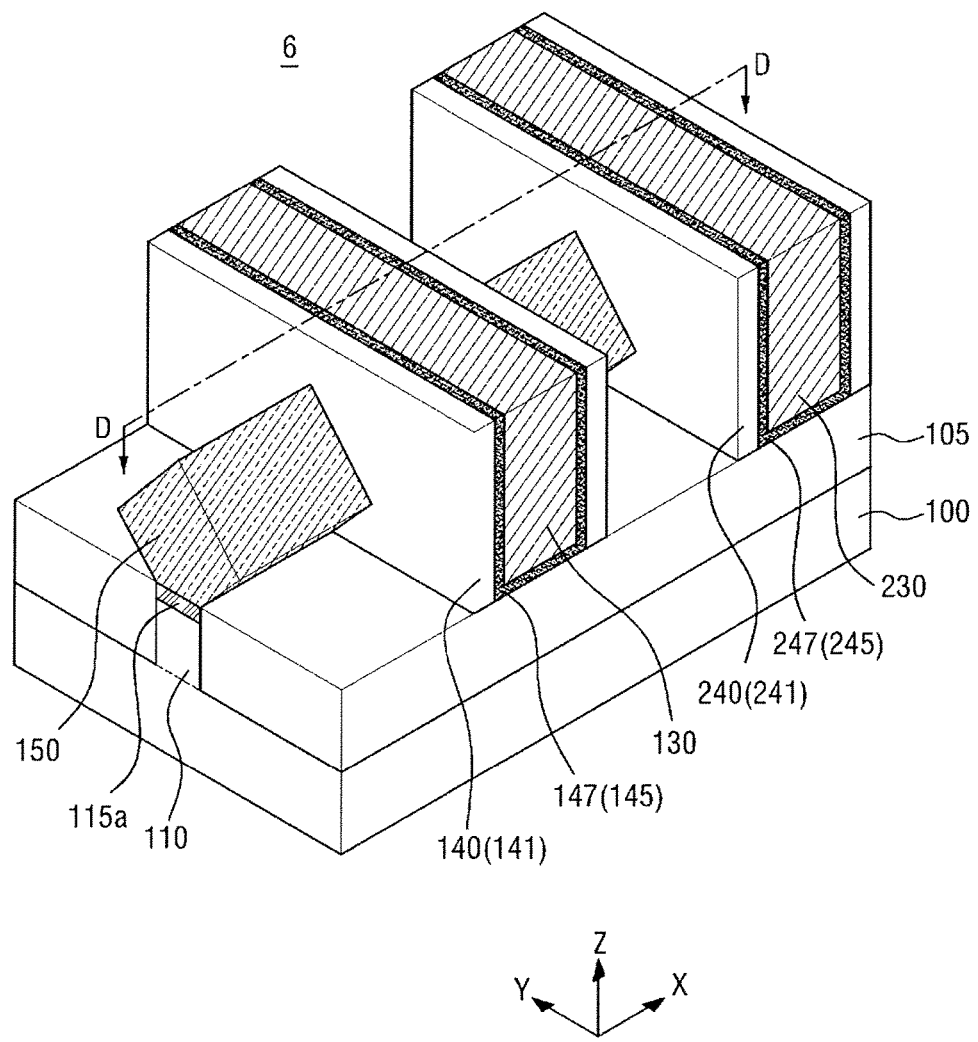
FIG. 14 is a perspective view of a semiconductor device according to an exemplary embodiment of the present inventive concept.
Figure 15:
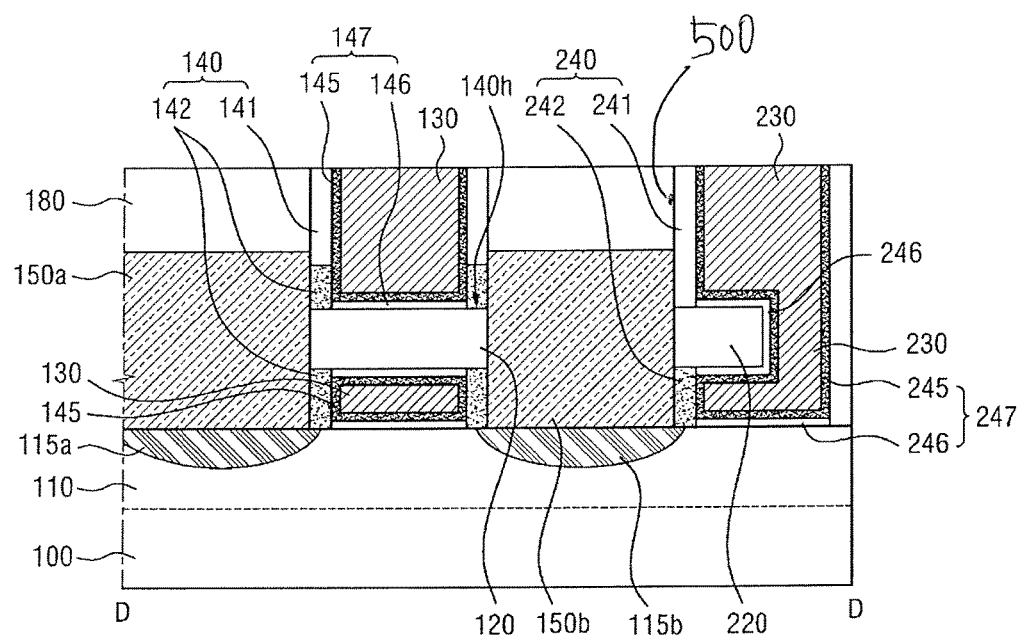
FIG. 15 is a cross sectional view taken along line D-D of FIG. 14.

FIG. 14 is a perspective view of a semiconductor device according to an exemplary embodiment, and FIG. 15 is a cross sectional view taken along line A-A of FIG. 14.

Referring to FIGS. 14 and 15, a semiconductor device 6 according to yet another embodiment may additionally include a second gate electrode 230, a second gate spacer 240, a second gate insulating layer 247, and a third nanowire 220.

The third nanowire 220 may be formed on the substrate 100 and spaced from the substrate 100. The third nanowire 220 may extend in the first direction X.

For example, the third nanowire 220 may be formed on the fin-type pattern 110 and spaced from the fin-type pattern 110. The third nanowire 220 may be overlapped with the fin-type pattern 110. The third nanowire 220 may be formed on the fin-type pattern 110, rather than being formed on the field insulating layer 105.

The third nanowire 220 may be overlapped with the first nanowire 120 in the first direction X. For example, the third nanowire 220 may be an extension from the first nanowire 120, which may be spaced from the first nanowire 120 by a separation process.

Further, the third nanowire 220 may include the same material as the fin-type pattern 110, or include a material different from that fin-type pattern 110. However, for convenience of explanation, it is assumed that the third nanowire 220 of the semiconductor device may include silicon.

The second gate electrode 230 may be formed on the field insulating layer 105 and the fin-type pattern 110. The second gate electrode 230 may extend in the second direction Y.

The second gate electrode 230 may be so formed as to surround the periphery of the third nanowire 220 which is spaced from the upper surface of the fin-type pattern 110. The second gate electrode 230 may be formed in a space defined between the third nanowire 220 and the fin-type pattern 110.

The second gate electrode 230 may include a conductive material. As illustrated, the gate electrode 230 may be a single layer, but not limited thereto. For example, the second gate electrode 230 may include a work function conductive layer which adjusts work function, and a filling conductive layer which fills a space formed by the work function conductive layer for work function adjustment.

For example, the second gate electrode 230 may include at least one of TiN, WN, TaN, Ru, TiC, TaC, Ti, Ag, Al, TiAl, TiAlN, TiAlC, TaCN, TaSiN, Mn, Zr, W, and Al. Alternatively, the second gate electrode 230 may each be formed of non-metal element such as Si or SiGe. For example, the second gate electrode 230 described above may be formed by replacement process, but not limited thereto.

The second gate spacer 240 may be formed on both sidewalls of the second gate electrode 230 which extends in the second direction Y. The second gate spacer 240 may be formed on both sides of the third nanowire 220 facing each other.

The third nanowire 220 may pass through only one of the two second gate spacers 240. However, exemplary embodiments are not limited to the examples provided above. Accordingly, like the first nanowire 120, the third nanowire 220 may pass through both of the two. It is assumed herein only for convenience of explanation that the third nanowire 220 may pass through only one of the second gate spacers 240. The third nanowire 220 has two ends among which only the end For example adjacent to the first nanowire 120 may pass through the second gate spacer 240. The passed second gate spacer 240 is one 240 of the two second gate spacers 240 that is adjacent to the first nanowire 120.

One of the second gate spacers 240 that is adjacent to the first nanowire 120 may include a second outer spacer 241 and a second inner spacer 242. The second outer spacer 241 may be in direct contact with the second inner spacer 242. The second inner spacer 242 may be disposed between the upper surface of the fin-type pattern 110 and the third nanowire 220, and in surface contact with the upper surface of the fin-type pattern 110. On a YZ cross section, the second inner spacer 242 may be surrounded by the third nanowire 220 and the second outer spacer 241.

The second outer spacer 241 and the second inner spacer 242 may include different materials from each other. When the material included in the second outer spacer 241 has a first dielectric constant and the material included in the second inner spacer 242 has a second dielectric constant, the first and the second dielectric constants may be different from each other.

In the semiconductor device according to an embodiment, the material included in the second outer spacer 241 may have a first dielectric constant which is greater than a second dielectric constant of the material included in the second inner spacer 242.

For example, the second outer spacer 241 may include at least one of silicon nitride (SiN), silicon oxynitride (SiON), silicon oxide (SiO$_2$), silicon oxycarbidenitride (SiOCN), and a combination thereof. For example, the second inner spacer 242 may include at least one of a low-k dielectric material, silicon nitride (SiN), silicon oxynitride (SiON), silicon oxide (SiO$_2$), silicon oxycarbidenitride (SiOCN), and a combination thereof. The low-k dielectric material may be the material that has a lower dielectric constant than the silicon oxide.

One of the second gate spacers 240 that is adjacent to the first nanowire 120 need not be penetrated by the third nanowire 220, and may include the second outer spacer 241, but not the second inner spacer 242.

The second gate insulating layer 247 may be formed between the third nanowire 220 and the second gate electrode 230. Further, the second gate insulating layer 247 may be formed between the field insulating layer 105 and the second gate electrode 230, between the fin-type pattern 110 and the second gate electrode 230, and between the second gate spacer 240 and the second gate electrode 230.

For example, the second gate insulating layer 247 may include a second interface layer 246 and a second high-k insulating layer 245, but not limited thereto. For example, the second interface layer 246 of the second gate insulating layer 247 may be omitted depending on a material for the third nanowire 220.

Because the second interface layer 246 may be formed on a periphery of the third nanowire 220, the second interface layer 146 may be formed between the third nanowire 220 and the second gate electrode 230, and between the fin-type pattern 110 and the second gate electrode 230. Meanwhile, the second high-k insulating layer 245 may be formed between the third nanowire 220 and the second gate electrode 230, between the fin-type pattern 110 and the second gate electrode 230, between the field insulating layer 105 and the second gate electrode 230, and between the second gate spacer 240 and the second gate electrode 230.

The second gate insulating layer 247 may be formed along the periphery of the third nanowire 220. The second gate insulating layer 247 may be formed along the upper surface of the field insulating layer 105 and the upper surface of the fin-type pattern 110. Additionally, the second gate insulating layer 247 may be formed along the sidewall of the second gate spacer 240. For example, the second gate insulating layer 247 may be formed along the sidewalls of the second outer spacer 241 and the second inner spacer 242.

When the third nanowire 220 includes silicon, the second interface layer 246 may include silicon oxide layer. At this time, the second interface layer 246 may be formed on the periphery of the third nanowire 220 and the upper surface of the fin-type pattern 110, but need not be formed along the sidewall of the second gate spacer 240.

The second high-k insulating layer 245 may include a high-k dielectric material having a higher dielectric constant than silicon oxide layer. For example, the high-k dielectric material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

A source/drain 150b may be disposed on an oxide region 115b, filling a trench 500 disposed between the first and the second gate electrodes. The trench 500 is defined by the first and the second gate spacers 140 and 240 and the oxide region 115b of the substrate 100. The oxide region 115b defines a bottom surface of the trench 500 without overlapping at least a portion of the first and the second gate electrodes 140 and 240.

As described above, when the second interface layer 246 is omitted, the second high-k insulating layer 245 may include not only the high-k dielectric material, but also silicon oxide layer, silicon oxynitride layer, or silicon nitride layer.

Hereinbelow, a method for fabricating a semiconductor device according to an embodiment will be explained with reference to FIGS. 16 to 33. The semiconductor device fabricated based on FIGS. 16 to 33 corresponds to the semiconductor device 5 described above with reference to FIG. 13.

Figure 29:
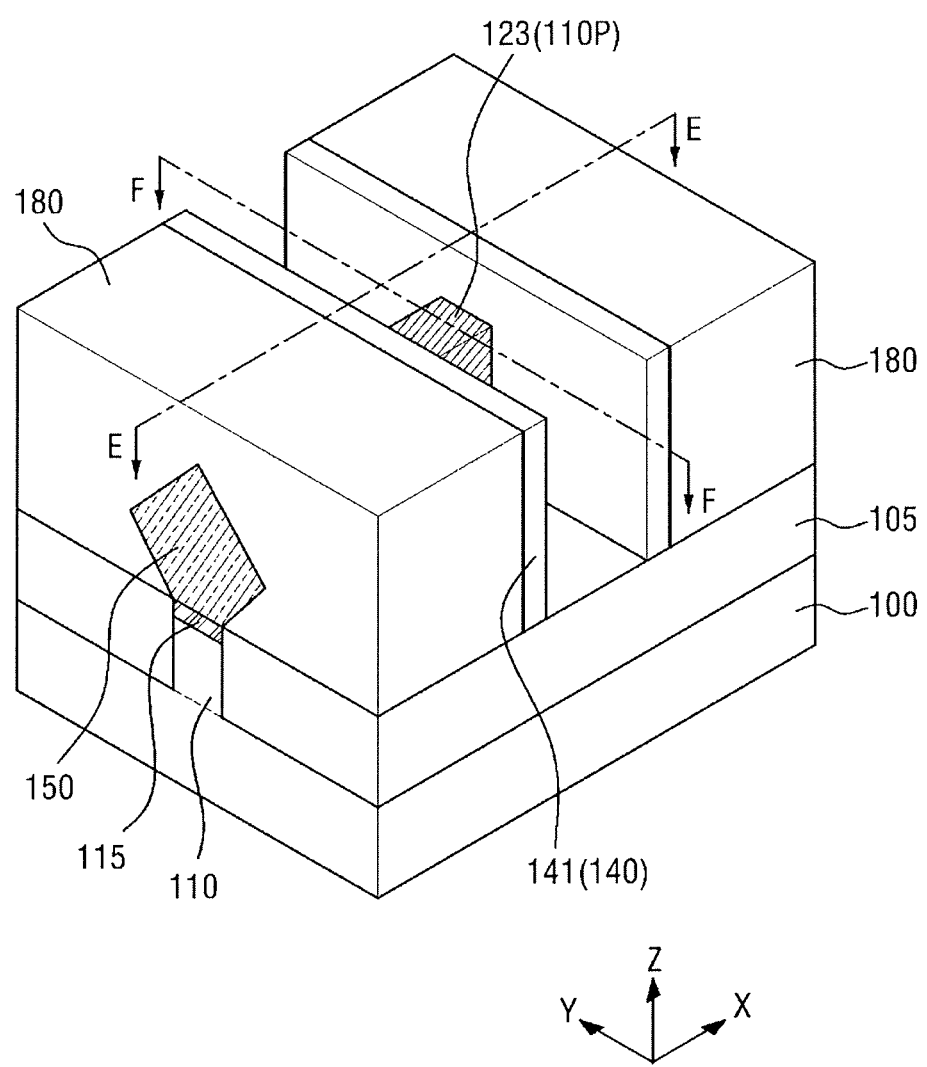
Figure 30:
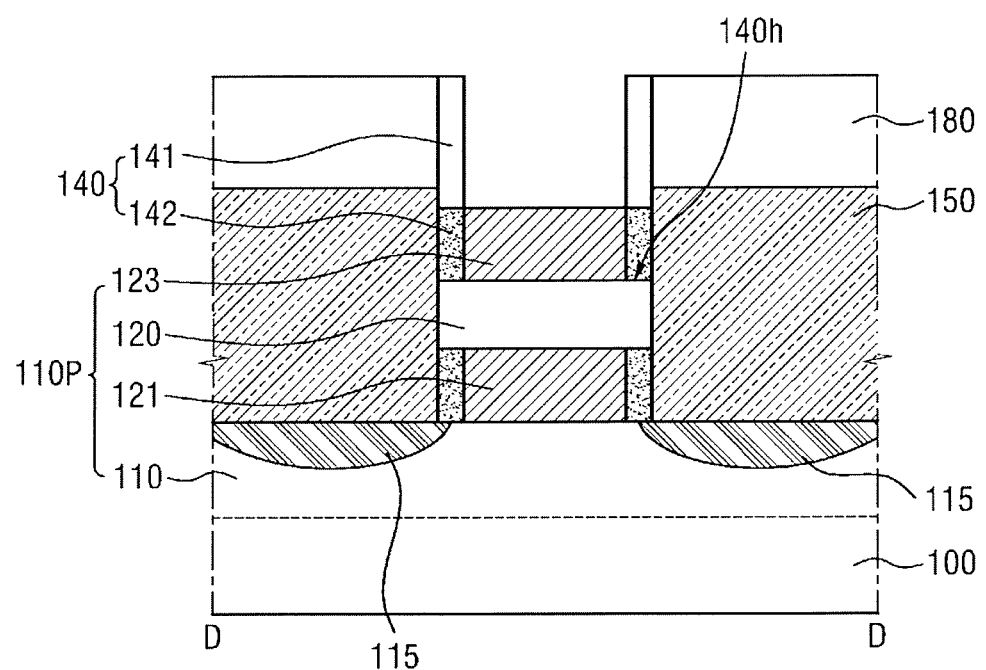
Figure 31:
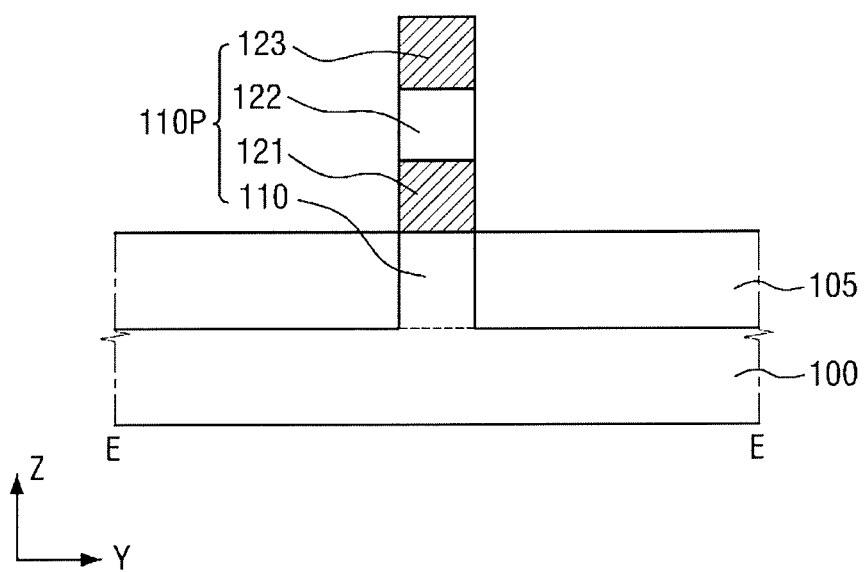

FIGS. 16 to 33 are views showing a method of fabricating a semiconductor device according to an exemplary embodiment. FIG. 30 is a cross sectional view taken along line E-E of FIG. 29, and FIG. 31 is a cross sectional view taken along line F-F of FIG. 29.

Figure 16:
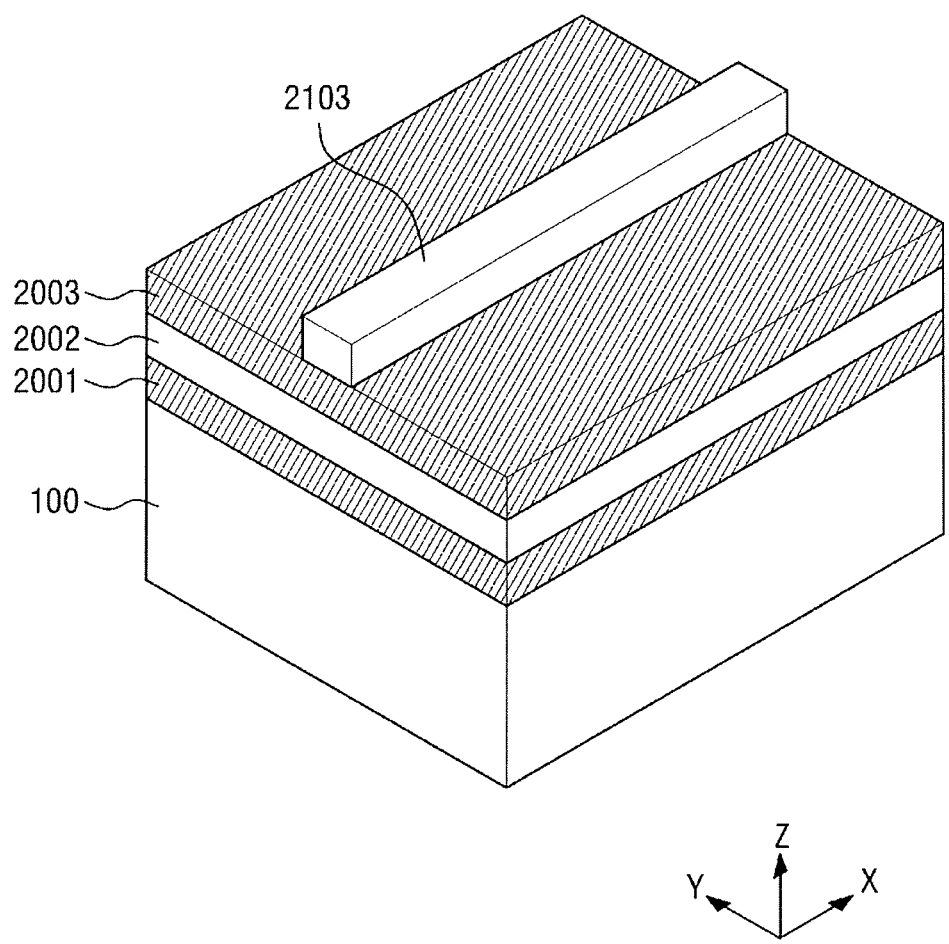
FIGS. 16 to 33 are views showing a method of fabricating a semiconductor device according to an exemplary embodiment of the present inventive concept.

Referring to FIG. 16, a first sacrificial layer 2001, an active layer 2002, and a second sacrificial layer 2003 are formed sequentially on the substrate 100.

The first sacrificial layer 2001 and the second sacrificial layer 2003 may include the same material, and the first sacrificial layer 2001 and the active layer 2002 may include different materials. In explaining a method for fabricating a semiconductor device according to an embodiment, it is assumed that the first sacrificial layer 2001 and the second sacrificial layer 2003 include the same material. Further, the active layer 2002 may include a material with an etch selectivity with respect to the first sacrificial layer 2001.

For example, the substrate 100 and the active layer 2002 may include a material to be used as a channel region for the transistor. For example, in the case of PMOS, the active layer 2002 may include a material of high hole mobility, while in the case of NMOS, the active layer 2002 may include a material with high electron mobility.

The first sacrificial layer 2001 and the second sacrificial layer 2003 may include a material having a similar lattice constant and lattice structure as the active layer 2002. For example, the first sacrificial layer 2001 and the second sacrificial layer 2003 may be a semiconductor material, or a crystallized metal material.

In explaining a method for fabricating a semiconductor device according to an embodiment, it is assumed that the active layer 2002 includes silicon, and the first sacrificial layer 2001 and the second sacrificial layer 2003 each include silicon germanium.

FIG. 16 illustrates only one active layer 2002, but this is only for illustrative purpose and the exemplary embodiments are not limited thereto. Accordingly, there may be plural pairs of the first sacrificial layer 2001 and the active layer 2002 formed in turn, with the second sacrificial layer 2003 being formed on the uppermost active layer 2002.

Further, although FIG. 16 illustrates the second sacrificial layer 2003 positioned on the uppermost portion of the stack layer structure, exemplary embodiments are not limited thereto. Accordingly, the active layer 2002 may be on the uppermost portion of the stack layer structure.

Next, a first mask pattern 2103 is formed on the second sacrificial layer 2003. The first mask pattern 2103 may be elongated in a first direction X.

For example, the first mask pattern 2103 may be formed of a material including at least one of silicon oxide, silicon nitride, and silicon oxynitride.

Figure 17:
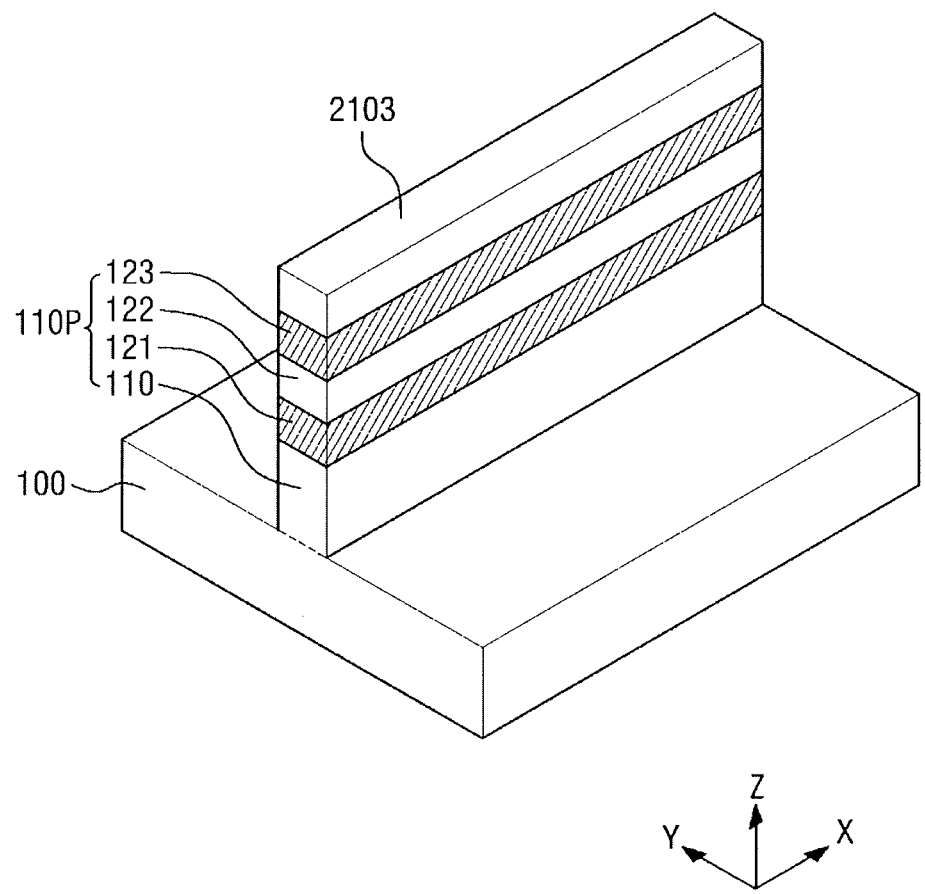

Referring to FIG. 17, etching process is performed with the first mask pattern 2103 as a mask, thus forming a fin-type structure 110P.

The fin-type structure 110P may be formed by patterning a portion of the second sacrificial layer 2003, the active layer 2002, the first sacrificial layer 2001, and the substrate 100.

The fin-type structure 110P may be formed on the substrate 100 and protruded from the substrate 100. The fin-type structure 110P may extend in the first direction X, as in the case of the first mask pattern 2103.

In the fin-type structure 110P, a fin-type pattern 110, a first sacrificial pattern 121, a pre-nanowire 122, and a second sacrificial pattern 123 are stacked sequentially on the substrate 100.

Figure 18:
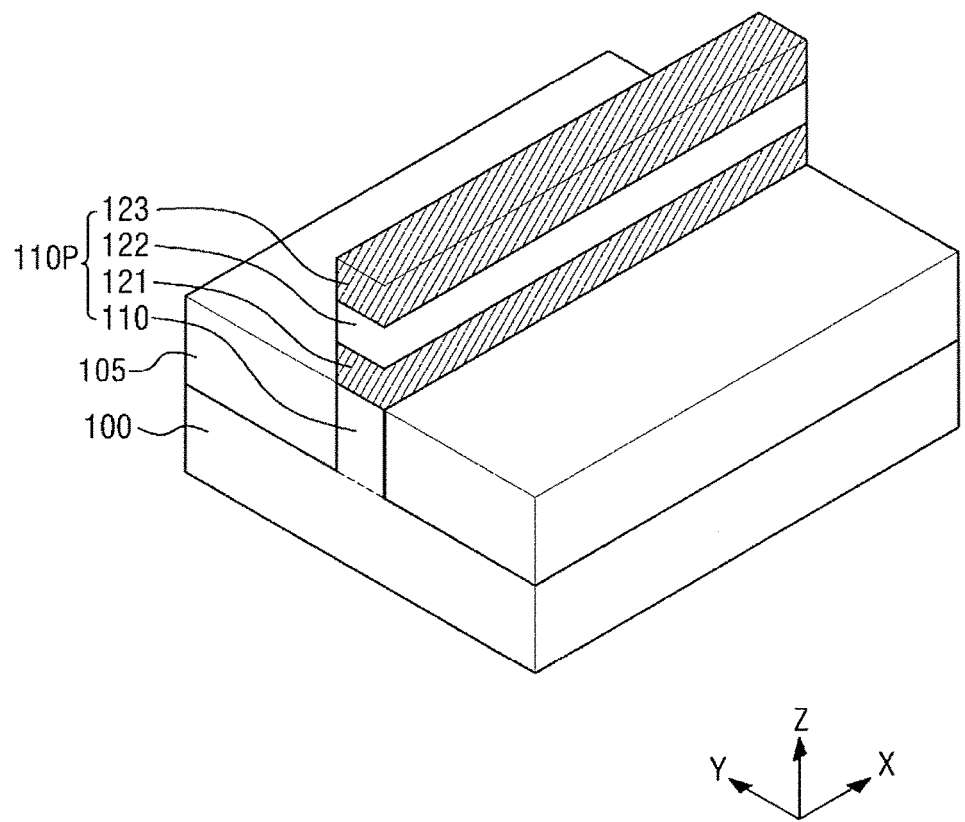

Referring to FIG. 18, the field insulating layer 105, covering at least a portion of the sidewall of the fin-type structure 110P, may be formed on the substrate 100.

For example, the field insulating layer 105 covering the fin-type structure 110P is formed on the substrate 100. With the planarization process of the field insulating layer 105, the upper surface of the fin-type structure 110P and the upper surface of the field insulating layer 105 may be placed on the same plane.

The first mask pattern 2103 may be removed in the process of the planarization, but not limited thereto.

The upper portion of the field insulating layer 105 is then recessed, thus exposing a portion of the fin-type structure 110P. The recess process may include etching process. For example, the fin-type structure 110P may be formed, protruding on the field insulating layer 105.

Referring to FIG. 18, the second sacrificial pattern 123, the pre-nanowire 122 and the first sacrificial pattern 121 may be protruded on the upper surface of the field insulating layer 105, and the sidewall of the fin-type pattern 110 may be completely surrounded by the field insulating layer 105, but exemplary embodiments are not limited thereto. For example, a portion of the sidewall of the fin-type pattern 110 may be protruded on the upper surface of the field insulating layer 105 through the recessing process of the upper portion of the field insulating layer 105.

The pre-nanowire 122 may be doped to adjust a threshold voltage of a transistor to be formed, before and/or after the recessing process which causes the portion of the fin-type structure 110P to protruded beyond the upper surface of the field insulating layer 105. When the semiconductor device 1-6 is an NMOS transistor, impurity may be boron (B). When the semiconductor device 1-6 is a PMOS transistor, the impurity may be phosphorus (P) or arsenic (As), but not limited thereto.

Figure 19:
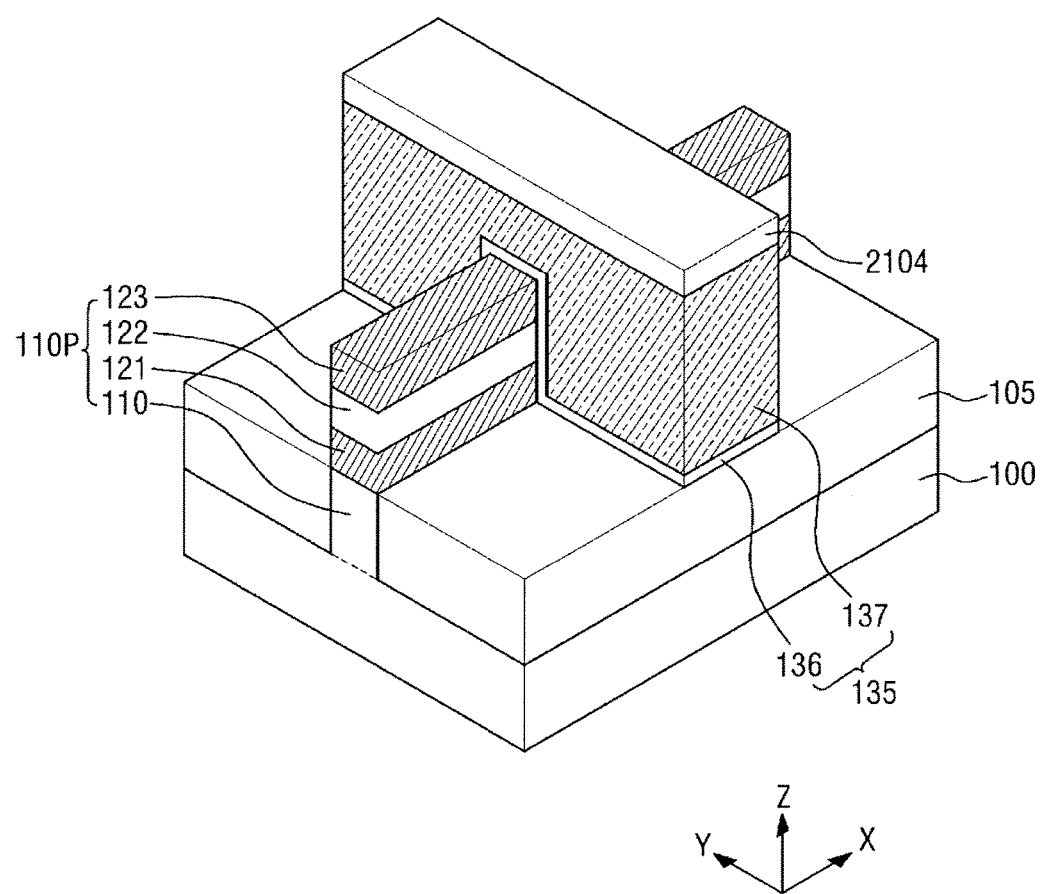

Referring to FIG. 19, a dummy gate pattern 135 may be formed, which extends across the fin-type structure 110P in the second direction Y, by performing the etching process with the second mask pattern 2104. The dummy gate pattern 135 may be formed on the fin-type structure 110P.

The dummy gate pattern 135 may include a dummy gate insulating layer 136 and a dummy gate electrode 137. For example, the dummy gate insulating layer 136 may include a silicon oxide layer, and the dummy gate electrode 137 may include polysilicon or amorphous silicon.

Figure 20:
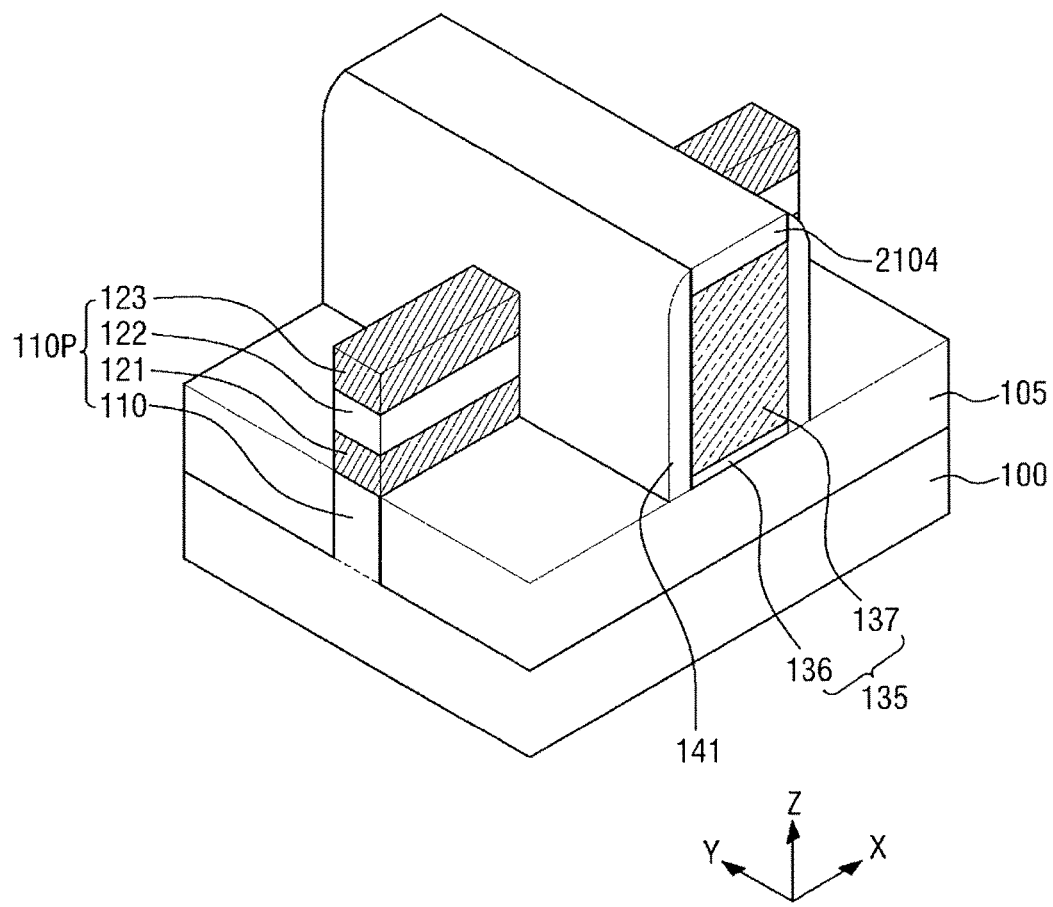

Referring to FIG. 20, the outer spacer 141 may be formed on the sidewall of the dummy gate pattern 135. For example, the outer spacer 141 may be formed on the sidewalls of the dummy gate insulating layer 136 and the dummy gate electrode 137.

For example, a first spacer layer is formed on the field insulating layer 105, covering the dummy gate pattern 135 and the fin-type structure 110P. The first spacer layer is then etched-back, thus leaving the outer spacer 141 on the sidewall of the dummy gate pattern 135.

Figure 21:
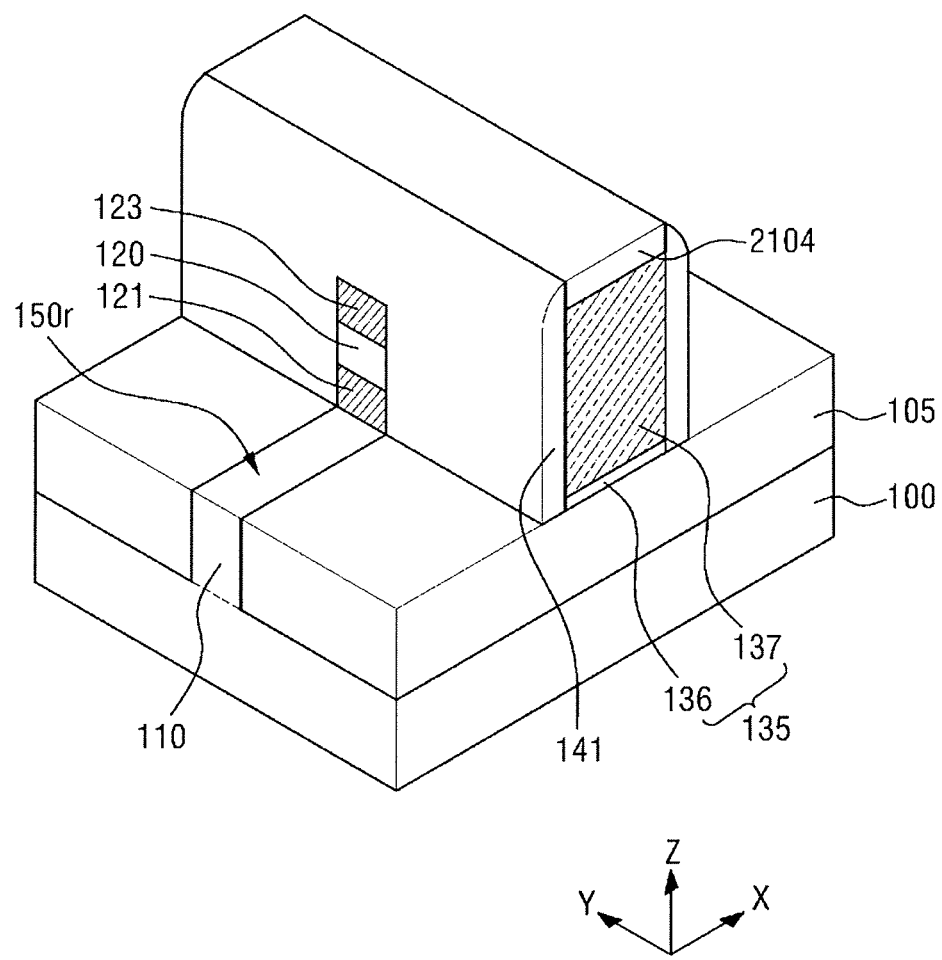

Referring to FIG. 21, the fin-type structure 110P, not overlapped with the dummy gate electrode 137 and the outer spacer 141, is removed, using an etching process. In the etching process, the dummy gate pattern 135 including the dummy gate electrode 137 may serve as an etch mask. By doing so, a recess 150r may be formed within the fin-type structure 110P. A bottom surface of the recess 150r may be the fin-type pattern 110.

Forming the outer spacer 141 and forming the recess 150r may be concurrently performed, although exemplary embodiments are not limited thereto. For example, the recess 150r may be formed by removing a portion of the fin-type structure 110P, after the outer spacer 141 is formed.

While the recess 150r is formed in the fin-type structure 110P, the first sacrificial pattern 121 and the second sacrificial pattern 123, which are not overlapped with the dummy gate electrode 137 and the outer spacer 141, may be removed. Further, while the recess 150r is formed in the fin-type structure 110P, the first nanowire 120 may be formed, as the pre-nanowire 122 that is not overlapped with the dummy gate electrode 137 and the outer spacer 141 is removed.

By the presence of the recess 150r, the cross section of the first sacrificial pattern 121, the cross section of the second sacrificial pattern 123, and the cross section of the first nanowire 120 may be exposed.

Figure 22:
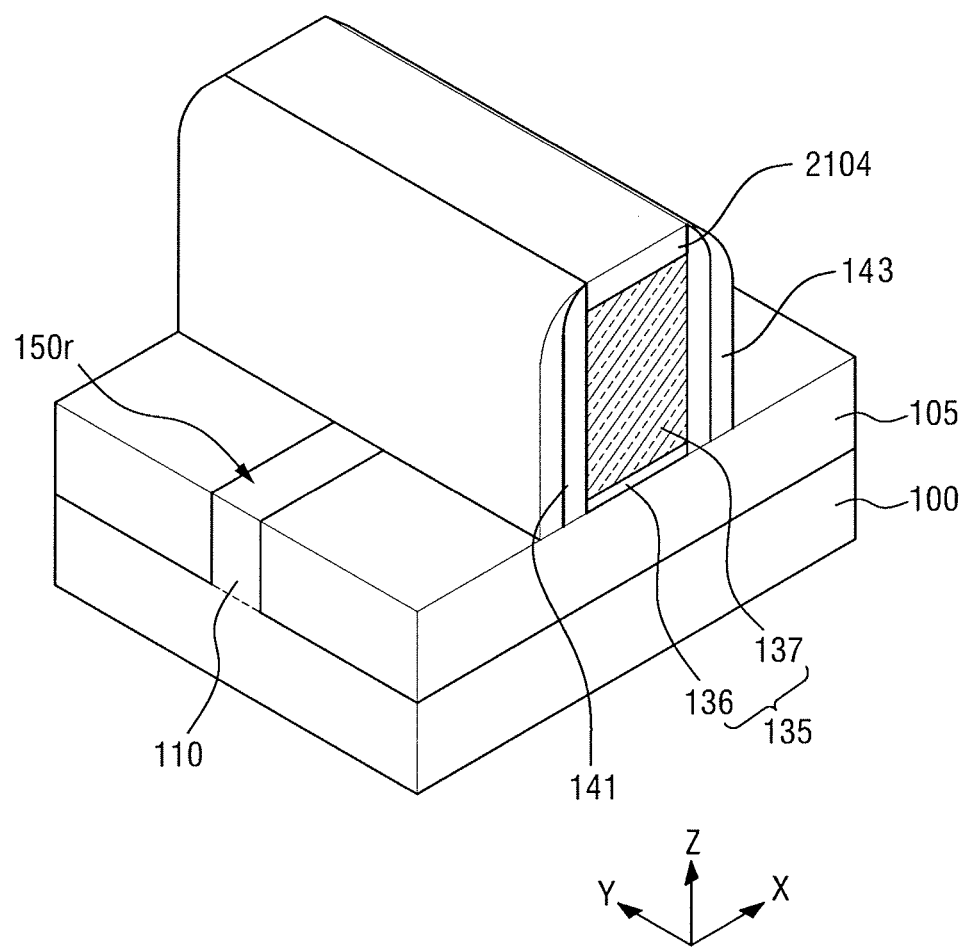

Referring to FIG. 22, an oxidation preventing layer 143 may be formed on the sidewall of the outer spacer 141. The oxidation preventing layer 143 may cover again the exposed cross sections of the first sacrificial pattern 121, the second sacrificial pattern 123 and the first nanowire 120.

For example, the oxidation preventing layer 143 may be carbon polymer or other insulating material. The oxidation preventing layer 143 may be removed at a later stage after the oxidation process. The material that can be treated with ashing or wet etching may be included, for possibility that ashing or wet etching is used for the removal. If the oxidation preventing layer 143 includes the other insulating material, the oxidation preventing layer 143 may have etch selectivity with respect to the gate spacer 140, and may be removed by an wet etching process using the etch selectivity.

For example, a pre-oxidation preventing layer is formed on the field insulating layer 105, covering the dummy gate pattern 135, the fin-type structure 110P and the outer spacer 141. The oxidation preventing layer 143 may be formed on the sidewall of the outer spacer 141, as the pre-oxidation preventing layer is etched back.

Forming the oxidation preventing layer 143 may be omitted depending on the types of oxidation processes that may follow. For example, for the oxidation process that has directivity, the oxidation process may be performed without necessarily requiring to form the oxidation preventing layer 143.

Figure 23:
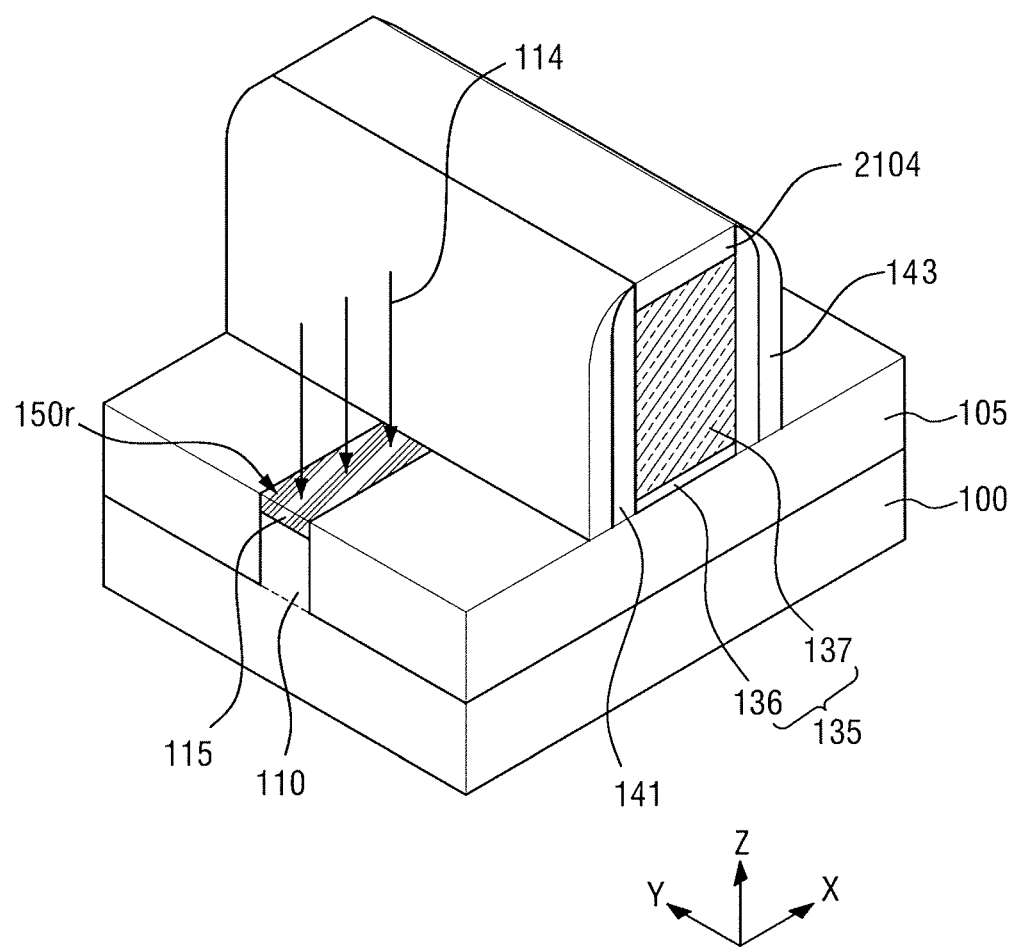

Referring to FIG. 23, an oxidation process 114 may be performed on the fin-type pattern 100 exposed through the recess 150r. The oxidation process may include a plasma oxidation process or an oxygen ion implantation process. In the oxidation process 114, an upper portion of the fin-type pattern 110 may be oxidized, changing to an oxide region 115. Accordingly, the fin-type pattern 110 may include the oxide region 115 as a part of the fin-type pattern 110. In this case, the oxide region 115 may be positioned in an upper part of the fin-type pattern 110.

The plasma oxidation process oxidizes by application of $O_2$ plasma in the third direction Z. At a high bias voltage supplied to the 100, only the upper portion of the fin-type pattern 110 may be oxidized. In an exemplary embodiment, the above-described process for forming the oxidation preventing layer 143 may be omitted.

The oxygen ion implantation oxidizes the upper portion of the fin-type pattern 110 by injecting oxygen ions to the fin-type pattern 110 using an ion injecting equipment, and then performing heat treatment. The oxygen ion implantation may allow ion implantation in the vertical direction. In an exemplary embodiment, the process for forming oxidation preventing layer 143 of FIG. 22 may be omitted.

Figure 24:
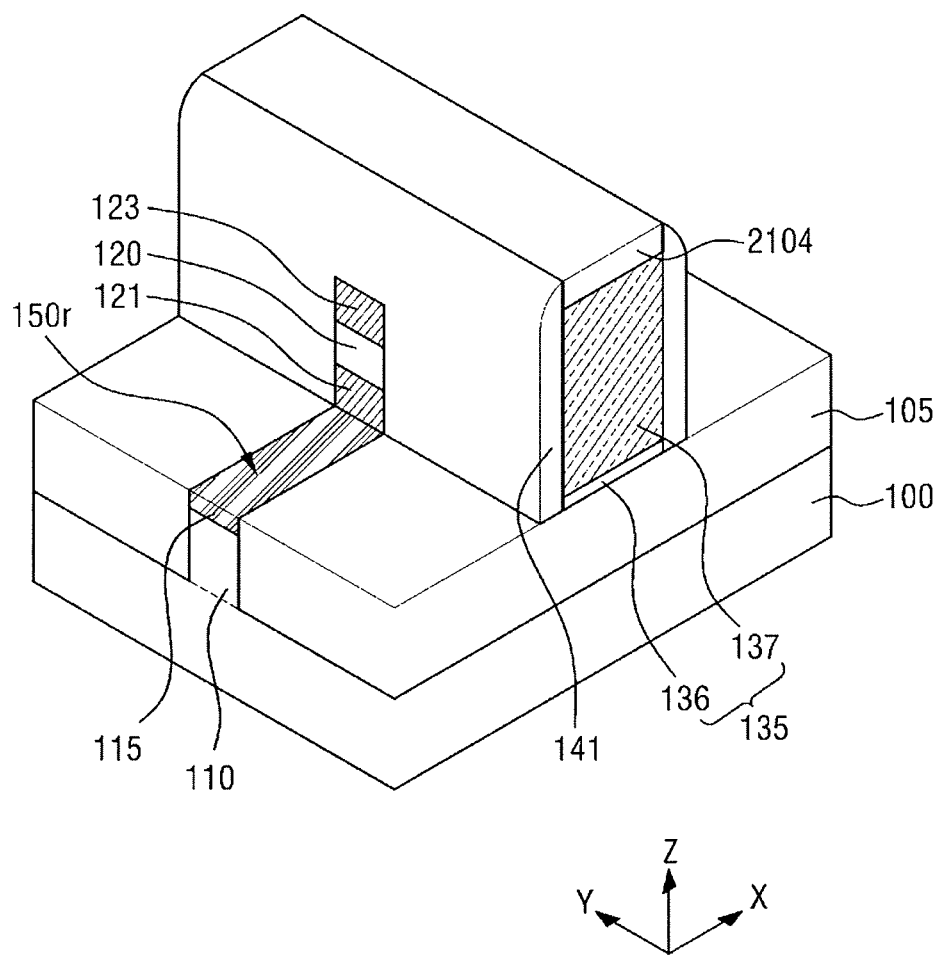

Referring to FIG. 24, the oxide region 115 may be formed by the oxidation process 114. The oxide region 115 may be formed in the upper portion of the fin-type pattern 110. For example, the thickness of the oxide region 115 may be, but is not limited to, about 10 nm. The thickness of the oxide region 115 may vary depending on the characteristics of the oxidation process 114. In an exemplary embodiment, the oxide region 115 may have a thickness gradually increasing and then decreasing along the first direction X.

Figure 25:
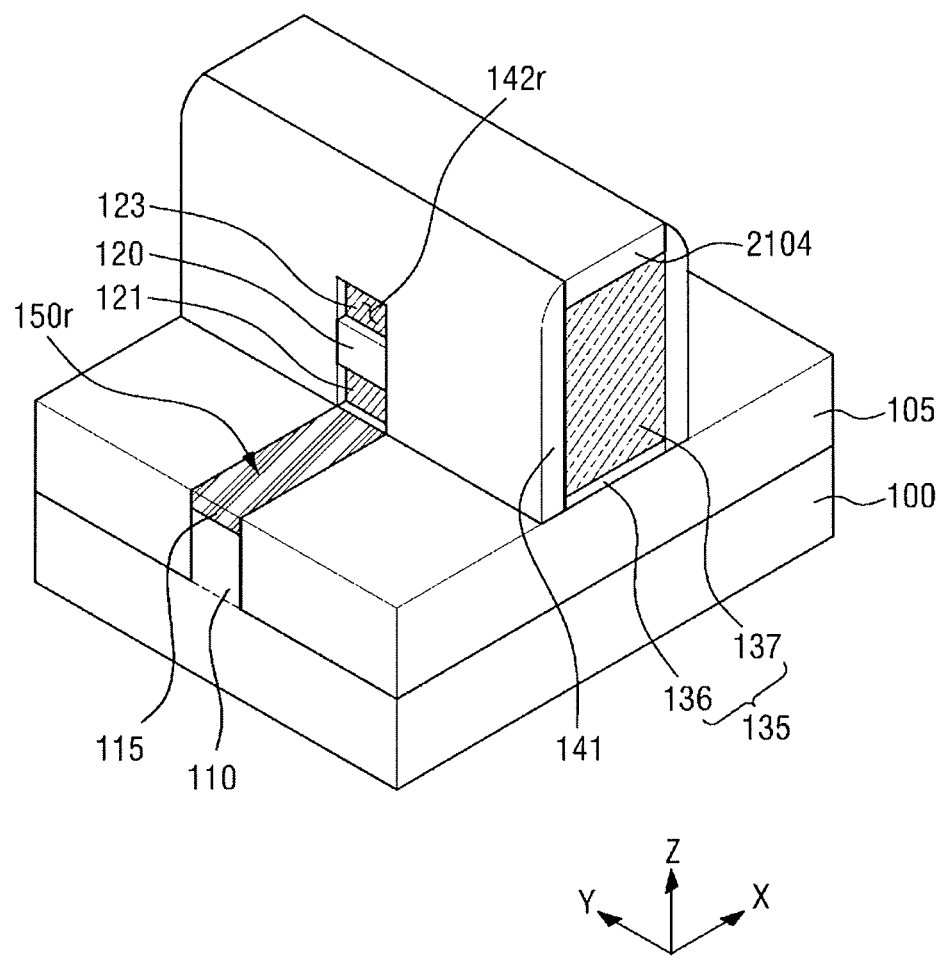

Referring to FIG. 25, at least a portion of the first sacrificial pattern 121 and at least a portion of the second sacrificial pattern 123, which are exposed by the recess 150r and overlapped with the outer spacer 141, may be removed to form a dimple 142r, which may be formed among the outer spacer 141 and the first nanowire 120.

The first nanowire 120 may be protruded from the first sacrificial pattern 121 and the second sacrificial pattern 123 which remain in the dimple 142r.

For example, the dimple 142r may be formed by using a selective etching process. For example, the dimple 142r may be formed by the etching process using an etchant with etch selectivity of the first sacrificial pattern 121 and the second sacrificial pattern 123 with respect to the first nanowire 120.

Figure 26:
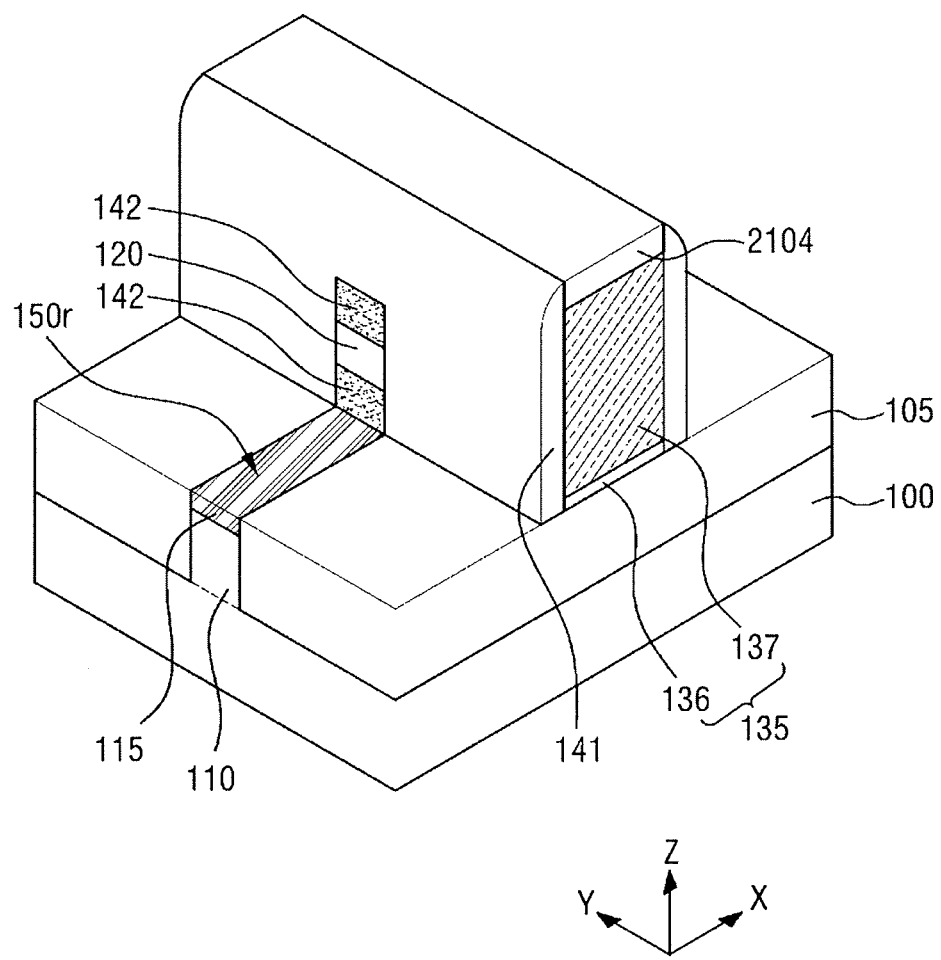

Referring to FIG. 26, the inner spacer 142 may be formed by filling in the dimple 142r with an insulating material.

For example, a second spacer layer may be formed, filling the dimple 142r. The second spacer layer may be a material with a good gap-filling capability. The second spacer layer may also be formed on the field insulating layer 105, the sidewall of the outer spacer 141, and the dummy gate pattern 135.

An etching process may then be performed to remove the second spacer layer until the upper surface of the fin-type pattern 110, which is not overlapped with the dummy gate pattern 135 and the outer spacer 141, is exposed. As a result, the inner spacer 142 may be formed.

At this time, the thickness of the inner spacer 142 may be controlled for the first nanowire 120 to protrude from the inner spacer 142. For example, the thickness of the inner spacer 142 may be equal to the thickness of the outer spacer 141. However, the present inventive concept is not limited to thereto. For example, the thickness of the inner spacer 142 may be different from the thickness of the outer spacer 141.

Accordingly, the gate spacer 140 including the outer spacer 141 and the inner spacer 142 may be formed.

Figure 27:
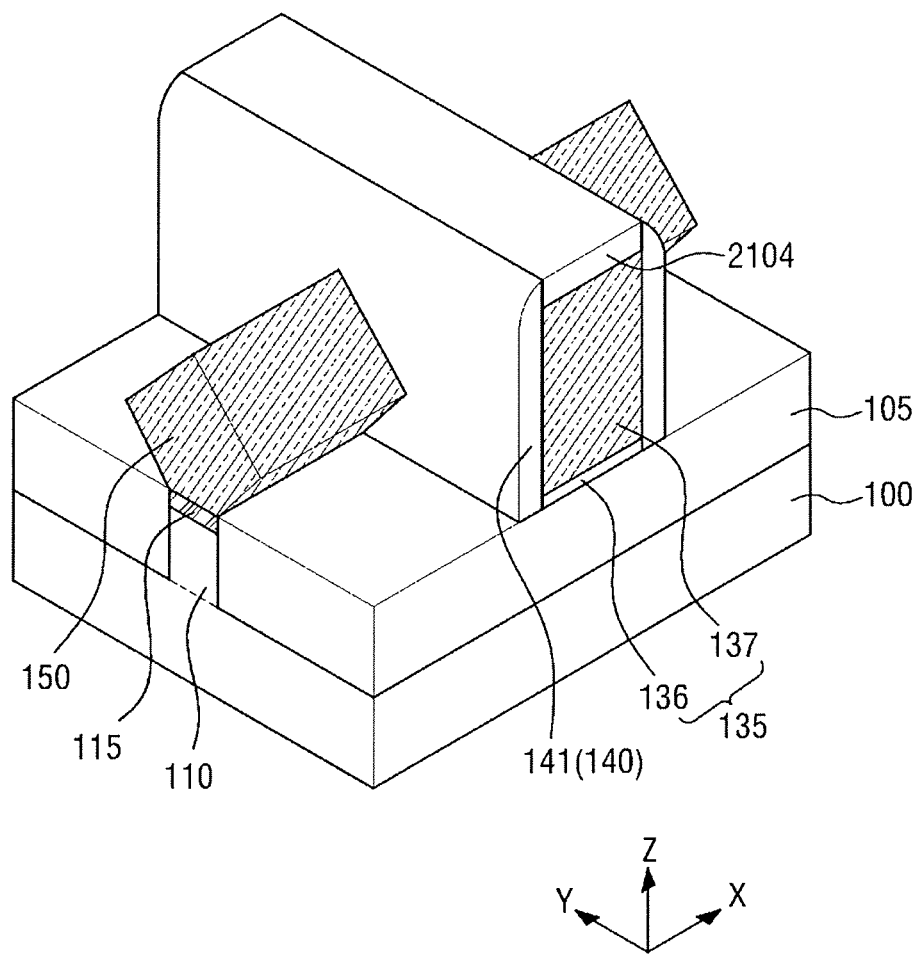

Referring to FIG. 27, a source/drain 150 for filling the recess 150r may be formed. The source/drain 150 may be formed on both sides of the dummy gate pattern 135.

The source/drain 150 may be formed on the oxide region 115 and the first nanowire 120 as the seed layer. The present inventive concept, however, is not limited thereto. For example, a seed layer is additionally formed on the cross section of the first nanowire 120 and the oxide region 115, which are exposed by the recess 150r.

The source/drain 150 may be formed to cover the inner spacer 142. The source/drain 150 may be in contact with the inner spacer 142.

The source/drain 150 may be formed by an epitaxial process. Depending on whether a semiconductor device according to exemplary embodiment is an n-type transistor or a p-type transistor, impurities doped in the epitaxial layer of the source/drain 150 may vary. In an exemplary embodiment, impurities may be doped in situ during epitaxial process.

Figure 28:
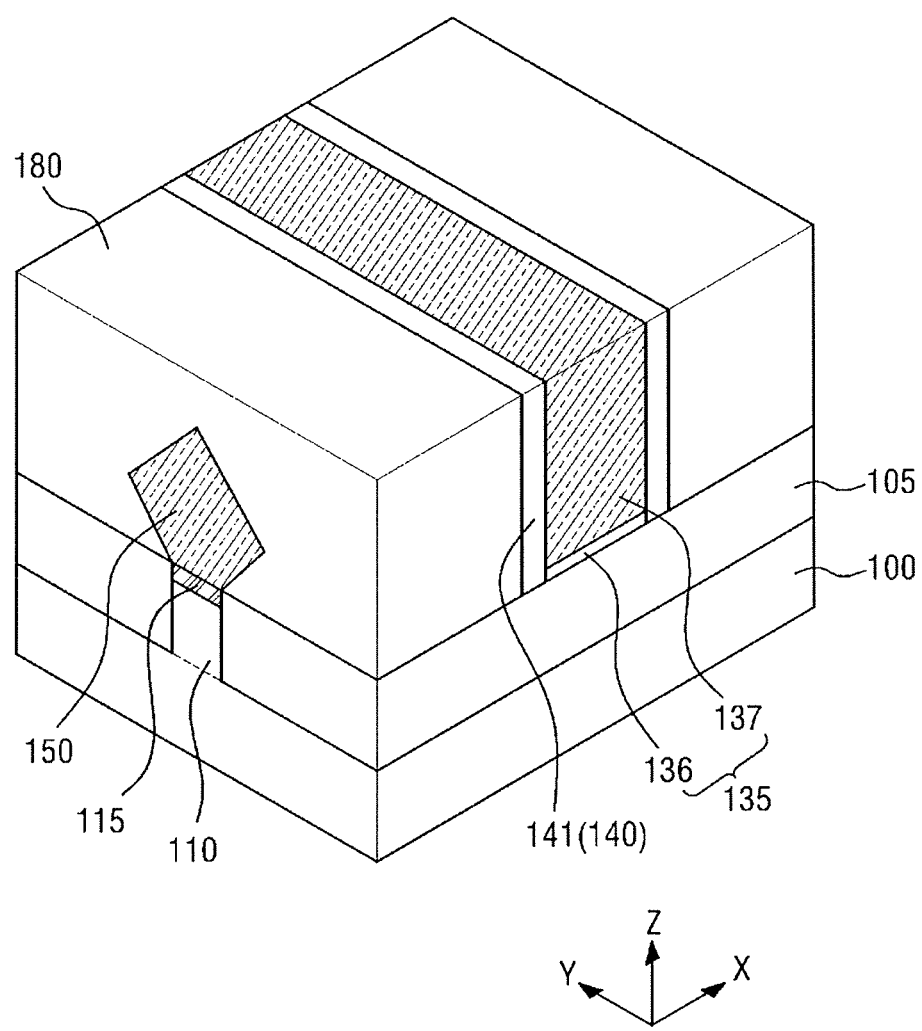

Referring to FIG. 28, an interlayer insulating layer 180 may be formed on the field insulating layer 105, covering the source/drain 150, the gate spacer 140, the dummy gate pattern 135, and so on.

The interlayer insulating layer 180 may include at least one of low-k dielectric material, oxide, nitride and oxynitride. For example, the low-k dielectric material may be flowable oxide (FOX), Tonen SilaZen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), flowable CVD (FCVD) oxide, or a combination thereof.

The interlayer insulating layer 180 is then planarized until the upper surface of the dummy gate electrode 137 is exposed. As a result, the second mask pattern 2104 is removed, exposing the upper surface of the dummy gate electrode 137.

Referring to FIGS. 29 to 31, it is possible to remove the dummy gate pattern 135, i.e., to remove the dummy gate insulating layer 136 and the dummy gate electrode 137.

With the removal of the dummy gate insulating layer 136 and the dummy gate electrode 137, the field insulating layer 105 and the fin-type structure 110P overlapped with the dummy gate pattern 135 may be exposed. For example, the first sacrificial pattern 121, the second sacrificial pattern 123 and the first nanowire 120 overlapped with the dummy gate pattern 135 may now be exposed.

Figure 32:
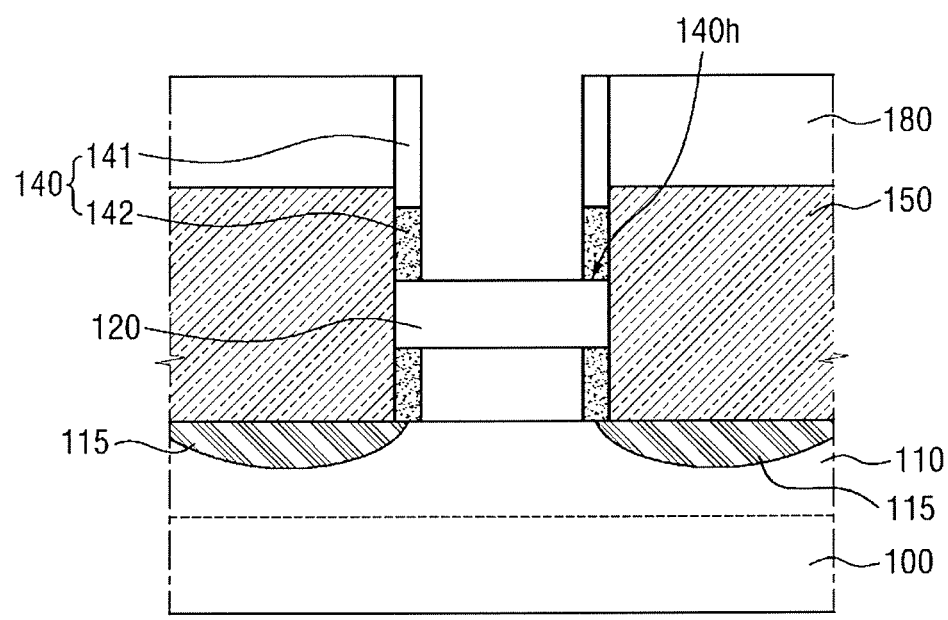
Figure 33:
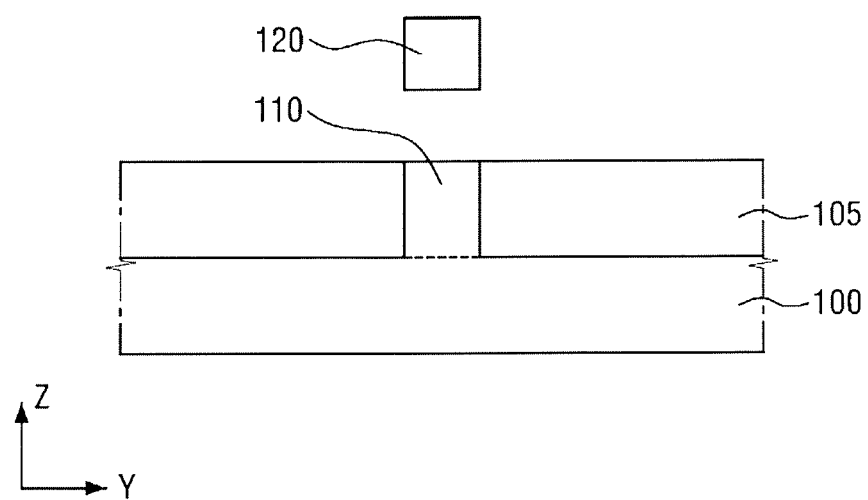

Referring to FIGS. 32 and 33, the first sacrificial pattern 121 and the second sacrificial pattern 123 may be removed from the fin-type structure 110P, and the first nanowire 120 may remain in the fin-type structure 110P.

As a result, a space may be formed between the first nanowire 120 and the fin-type pattern 100, and the first nanowire 120 may be formed over the fin-type pattern 110.

Removing the first sacrificial pattern 121 and the second sacrificial pattern 123 over and under the first nanowire 120 may be performed by, for example, an etching process. For example, etch selectivity of the first sacrificial pattern 121 and the second sacrificial pattern 123 with respect to the first nanowire 120 may be utilized.

Additionally, the removal of the first sacrificial pattern 121 and the second sacrificial pattern 123 may allow the inner spacer 142 of the gate spacer 140 to be exposed.

Referring back to FIG. 13, an interface layer 146 may be formed on a periphery of the first nanowire 120 and the upper surface of the fin-type pattern 110.

The high-k insulating layer 145 may then be formed on the sidewall of the gate spacer 140, i.e., on sidewalls of the outer spacer 141 and the inner spacer 142, and along the periphery of the first nanowire 120. The high-k insulating layer 145 may be in contact with the inner spacer 142. Accordingly, the gate insulating layer 147 including the interface layer 146 and the high-k insulating layer 145 may be formed.

Next, the gate electrode 130 may be formed, surrounding the first nanowire 120 and extending in the second direction Y. The gate electrode 130 may be a replacement metal gate electrode.

Next, a contact 190-1 may be formed, passing through the interlayer insulating layer 180 and the source/drain 150. In the forming of the contact 190-1, the oxide region 115 may be used as an etch stop layer. For example, the source/drain 150 may be etched until the exposure of the oxide region 115.

Figure 34:
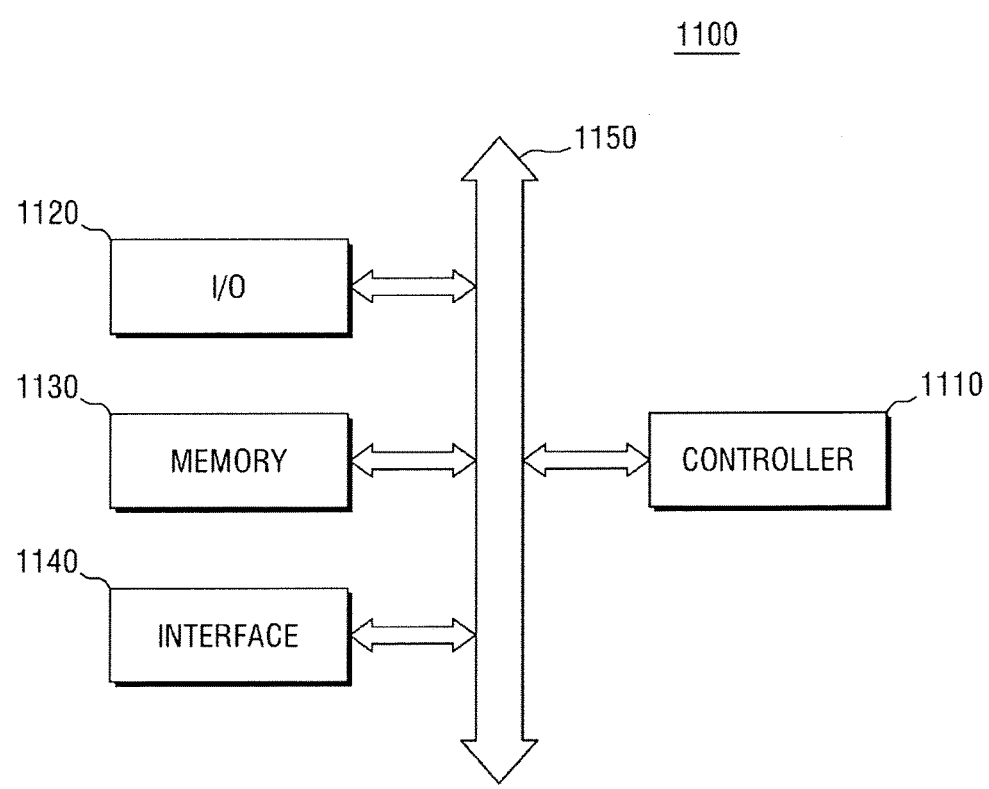
FIG. 34 is a block diagram of an electronic system comprising a semiconductor device according to an exemplary embodiment of the present inventive concept.

FIG. 34 is a block diagram of an electronic system comprising a semiconductor device according to several embodiments.

Referring to FIG. 34, an electronic system 1100 according to an exemplary embodiment may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of a microprocessor, a digital signal processor, a micro controller and a logic device capable of performing functions similar to those mentioned above. The I/O device 1120 may include a keypad, a keyboard, or a display device. The memory device 1130 may store data and/or commands. The interface 1140 may perform a function of transmitting data to communication networks or receiving data from the communication networks. The interface 1140 may be wired or wireless. For example, the interface 1140 may include an antenna or a wired/wireless transceiver. Although not illustrated, the electronic system 1100 may additionally include an operation memory configured to enhance operation of the controller 1110, such as a high-speed dynamic random access memory (DRAM) and/or a static random access memory (SRAM). According to an exemplary embodiment, a semiconductor device fabricated according to an exemplary embodiment may be provided within the memory device 1130, or provided as a part of the controller 1110, or the I/O device 1120.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

Figure 35:
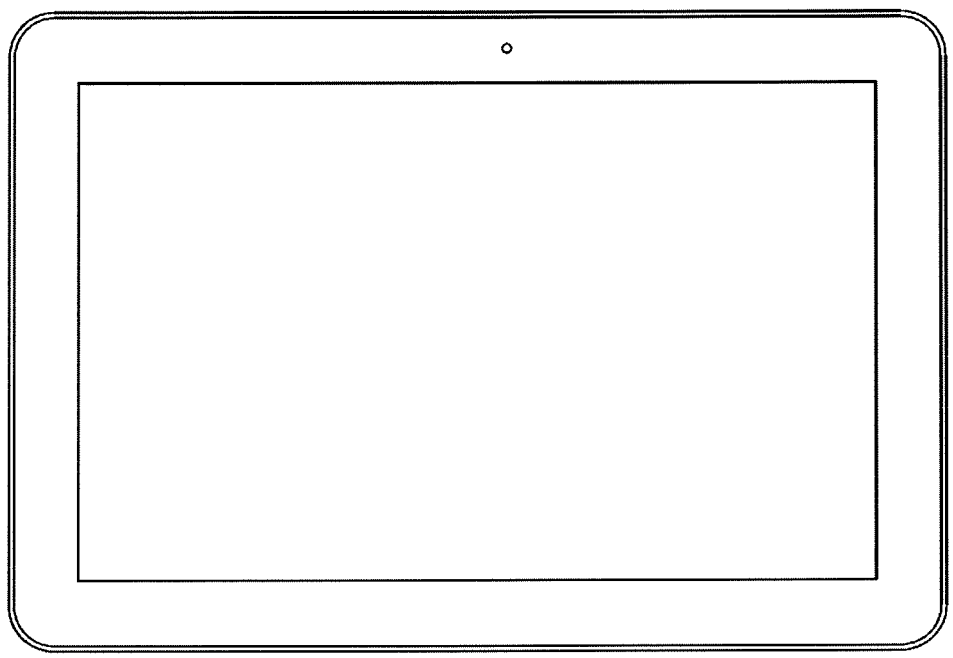
FIGS. 35 and 36 show semiconductor systems including a semiconductor device according to an exemplary embodiment of the present inventive concept.
Figure 36:
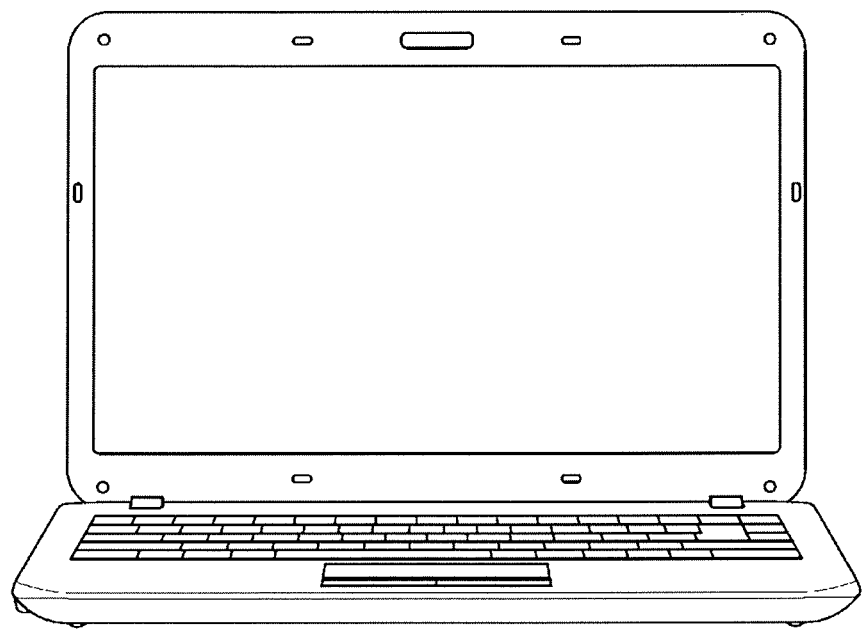

FIGS. 35 and 36 illustrate exemplary semiconductor system including a semiconductor device according to an exemplary embodiment. FIG. 35 illustrates a tablet PC and FIG. 36 illustrates a laptop computer. A semiconductor device according to an exemplary embodiment may be used in the tablet PC or the laptop computer. A semiconductor device according to an exemplary embodiment may be applicable to an integrated circuit device not illustrated herein.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
   a fin-type pattern protruded from a substrate, wherein the fin-type pattern is extended in a first direction,
   a first oxide region and a second oxide region on an upper portion of the fin-type pattern wherein the first oxide region and the second oxide region are spaced apart from each other and separated from each other;
   a first nanowire extended in the first direction and spaced apart from the fin-type pattern;
   a gate electrode surrounding the first nanowire and extending in a second direction intersecting the first direction, wherein the gate electrode is disposed on a region of the fin-type pattern and wherein the region is positioned between the first oxide region and the second oxide region;
   a first source/drain disposed on the first oxide region and connected with an end portion of the first nanowire; and
   a second source/drain disposed on the second oxide region and connected with another end portion of the first nanowire.

2. The semiconductor device of claim 1, further comprising:
   a second nanowire disposed on the first nanowire and extended in the first direction,
   wherein the first nanowire is interposed between the second nanowire and the region of the fin-type pattern, and
   wherein the gate electrode surrounds the second nanowire.

3. The semiconductor device of claim 1, further comprising:
   a gate spacer formed on a sidewall of the gate electrode, wherein the first oxide region comprises:
     a first region overlapped with the source/drain; and
     a second region overlapped with the gate spacer.

4. The semiconductor device of claim 3,
   wherein the first region is thicker the second region.

5. The semiconductor device of claim 3,
   wherein the first oxide region further comprises:
     a third region overlapped with the gate electrode,
     wherein the second region is thicker than the third region.

6. The semiconductor device of claim 1, further comprising:
   an interlayer insulating layer disposed on the first source/drain; and
   a contact disposed in the first source/drain and the interlayer insulating layer,
   wherein a bottom surface of the contact is lower than a lower surface of the first nanowire.

7. The semiconductor device of claim 6,
   wherein the contact is in direct contact with the first oxide region.

8. The semiconductor device of claim 7,
   wherein an entire lower surface of the contact is in contact with the first oxide region.

9. The semiconductor device of claim 6, further comprising:
   a second nanowire disposed on the first nanowire, wherein the first nanowire is interposed between the second nanowire and the region of the fin-type pattern,
   wherein the second nanowire is extended in the first direction, and wherein the gate electrode surrounds the second nanowire being, and
   wherein a distance between the contact and the first nanowire is substantially equal to a distance between the contact and the second nanowire.

10. The semiconductor device of claim 1,
    wherein the first source/drain is overlapped with the first oxide region, and
    wherein the fin-type pattern is separated from the first nanowire.

11. The semiconductor device of claim 10,
    wherein the first source/drain is completely overlapped with the first oxide region.

12. The semiconductor device of claim 10,
    wherein the first source/drain comprises:
      a first region and a second region different from each other, the second region being located between the first region and the gate electrode; and the first oxide region overlapped with the second region and not overlapped with the first region.

13. A semiconductor device, comprising:
    a substrate having an oxide region;
    first and second nanowires spaced apart from the substrate, extending in a first direction, and spaced apart from each other in the first direction;
    a first gate electrode surrounding first nanowire and extending in a second direction intersecting the first direction;
    a second gate electrode surrounding the second nanowire and extending in the second direction;
    first and second gate spacers disposed on sidewalls of the first and the second gate electrodes, respectively;
    a trench disposed between the first and the second gate electrodes, wherein the trench is defined by the first and the second gate spacers, and the oxide region of the substrate, wherein the oxide region defines a bottom surface of the trench without overlapping at least a portion of the first and the second gate electrodes; and
    a source/drain disposed on the oxide region and filling the trench.

14. The semiconductor device of claim 13,
    wherein the oxide region completely overlaps the source/drain.

15. The semiconductor device of claim 13,
    wherein an upper surface of the oxide region is in contact with at least one of a lower surface of the first gate spacer and a lower surface of the second gate spacer.

16. The semiconductor device of claim 13,
    wherein the oxide region includes a first region, a second region and a third region, wherein the first region is adjacent to the first gate spacer, the third region is adjacent to the second gate spacer, and the second region is disposed between the first and the third regions, and wherein the second region is thicker than the first and the second regions.

17. A semiconductor device, comprising:

a substrate;

a first nanowire spaced apart from the substrate and extending in a first direction;

a gate electrode surrounding the first nanowire and extending in a second direction intersecting with the first direction; and a source/drain disposed on at least one side of the gate electrode and connected with the first nanowire;

a contact formed in the source/drain and overlapped in the first direction with the first nanowire; and an oxide layer interposed between the contact and the substrate.

18. The semiconductor device of claim 17, wherein the oxide layer is in contact with a lower surface of the source/drain.

19. The semiconductor device of claim 18, wherein the oxide layer comprises:

a first region in contact with a lower surface of the contact; and a second region in contact with the lower surface of the source/drain, and wherein the first region is thicker than the second region.

* * * * *